United States Patent
Levi et al.

(10) Patent No.: US 10,521,530 B2
(45) Date of Patent: Dec. 31, 2019

(54) DATA-DEPENDENT DELAY CIRCUITS

(71) Applicant: Bar-Ilan University, Ramat-Gan (IL)

(72) Inventors: Itamar Levi, Lehavim (IL); Osnat Keren, Rosh HaAyin (IL); Alexander Fish, Tel-Mond (IL)

(73) Assignee: Bar-Ilan University, Ramat-Gan (IL)

( * ) Notice: Subject to any disclaimer, the term of this patent is extended or adjusted under 35 U.S.C. 154(b) by 109 days.

(21) Appl. No.: 15/636,902

(22) Filed: Jun. 29, 2017

(65) Prior Publication Data

US 2018/0032655 A1   Feb. 1, 2018

Related U.S. Application Data

(60) Provisional application No. 62/367,672, filed on Jul. 28, 2016.

(51) Int. Cl.
| | |
|---|---|
| *G06F 17/50* | (2006.01) |
| *H03K 5/135* | (2006.01) |
| *H03L 7/081* | (2006.01) |
| *G06F 1/10* | (2006.01) |

(52) U.S. Cl.
CPC .......... *G06F 17/5022* (2013.01); *G06F 1/10* (2013.01); *H03K 5/135* (2013.01); *H03L 7/0814* (2013.01); *G06F 17/5027* (2013.01)

(58) Field of Classification Search
CPC .... G06F 17/5022; G06F 17/5027; G06F 1/10; H03K 5/135; H03L 7/0814
See application file for complete search history.

(56) References Cited

U.S. PATENT DOCUMENTS

| | | | |
|---|---|---|---|
| 6,545,507 B1 | 4/2003 | Goller | |
| 7,127,620 B2 | 10/2006 | Boeckeler | |
| 7,492,849 B2 | 2/2009 | On et al. | |
| 7,590,880 B1 | 9/2009 | Hershman | |
| 7,660,364 B2 | 2/2010 | Sandner et al. | |

(Continued)

FOREIGN PATENT DOCUMENTS

| | | |
|---|---|---|
| DE | 102014009808 | 1/2016 |
| EP | 1924023 | 5/2008 |

(Continued)

OTHER PUBLICATIONS

Alioto et al. "A General Power Model of Differential Power Analysis Attacks to Static Logic Circuits", IEEE Transactions on Very Large Scale Integration (VLSI) Systems, 18(5): 711-724, Published Online Apr. 23, 2010.

(Continued)

*Primary Examiner* — Vuthe Siek

(57) ABSTRACT

A method of designing a logic circuit with data-dependent delays is performed using an electronic design automation system. The logic circuit includes logic paths from logic inputs to at least one logic output. The method includes:
obtaining an initial circuit design;
specifying respective delays for multiple logic paths in the initial circuit design such that at least some of the outputs switch at different times within a clock cycle for different combinations of logic input levels; and
forming a second circuit design having the specified respective delays along the respective logic paths by adding delay elements to the initial circuit design based on the specified respective delays.

26 Claims, 28 Drawing Sheets

(56) References Cited

U.S. PATENT DOCUMENTS

| | | | |
|---|---|---|---|
| 7,694,242 B1* | 4/2010 | Li | G06F 17/5045 716/100 |
| 7,907,722 B2 | 3/2011 | Timmermans | |
| 8,296,704 B1* | 10/2012 | Kipper | G06F 17/5031 716/115 |
| 9,209,960 B1 | 12/2015 | Leung et al. | |
| 2002/0131596 A1 | 9/2002 | Boeckeler | |
| 2003/0197529 A1 | 10/2003 | Campbell | |
| 2011/0285420 A1 | 11/2011 | Deas et al. | |
| 2012/0200313 A1 | 8/2012 | Kyue et al. | |
| 2014/0259161 A1 | 9/2014 | Kastner et al. | |
| 2019/0220554 A1 | 7/2019 | Levi et al. | |

FOREIGN PATENT DOCUMENTS

| | | |
|---|---|---|
| EP | 1926241 | 5/2008 |
| WO | WO 2018/002934 | 1/2018 |
| WO | WO 2018/002939 | 1/2018 |
| WO | WO 2019/167050 | 9/2019 |

OTHER PUBLICATIONS

Alioto et al. "Effectiveness of Leakage Power Analysis Attacks on DPA-Resistant Logic Styles Under Process Variations", IEEE Transactions on Circuits and Systems I: Regular Papers, 61(2): 429-442, Published Online Jan. 24, 2014.

Alioto et al. "Leakage Power Analysis Attacks Against a Bit Slice Implementation of the Serpent Block Cipher", 2014 Proceedings of the 21st International Conference on Mixed Design of Integrated Circuits and Systems, MIXDES 2014, Lublin, Poland, Jun. 19-21, 2014, p. 241-246, Jun. 19, 2014.

Alioto et al. "Leakage Power Analysis Attacks: A Novel Class of Attacks to Nanometer Cryptographic Circuits", IEEE Transactions on Circuits I: Regular Papers, 57(2): 355-367, Published Online Feb. 10, 2010.

Alioto et al. "Leakage Power Analysis Attacks: Well-Defined Procedure and First Experimental Results", 2009 International Conference on Microelectronics, ICM, Marrakech, Marocco, Dec. 19-21, 2009, p. 46-49, Dec. 19, 2009.

Arunachalam et al. "False Coupling Interactions in Static Timing Analysis", Proceedings of the 38th Annual Design Automation Conference, DAC 2001, Las Vegas, Nevada, USA, Jun. 18-22, 2001, p. 726-731, Jun. 18, 2001.

Avital et al. "Randomized Multitopology Logic Against Differential Power Analysis", IEEE Transactions on Very Large Scale Integration (VLSI) Systems, 23(4): 702-711, Jun. 4, 2014.

Baddam et al. "Divided Backend Duplication Methodology for Balanced Dual Rail Routing", Proceedings of the 10th International Workshop on Cryptographic Hardware and Embedded Systems, CHES 2008, Washington, DC, USA, Aug. 10-13, 2008, p. 396-410, Aug. 10, 2008.

Balasch et al. "On the Cost of Lazy Engineering for Masked Software Implementations", 13th International Conference on Smart Card Research and Advanced Applications, CARDIS 2014, Paris, France, Nov. 5-7, 2014, LNCS 8968: 64-81, Nov. 5, 2014.

Batina et al. "Public-Key Cryptography for RFID-Tags", 5th Annual IEEE International Conference on Pervasive Computing and Communications Workshop, PerComW'07, White Plains, NY, USA, Mar. 19-23, 2007, p. 217-222, Mar. 19, 2007.

Becker et al. "Test Vector Leakage Assessment (TVLA) Methodology in Practice", International Cryptographic Module Conference, 1001: 1-13, 2013.

Bilgin et al. "A More Efficient AES Threshold Implementation", Proceedings of the 7th International Conference on Cryptology in Africa, Africacrypt 2014, Marrakesh, Morocco, May 28-30, 2014, 8469: 267-284, May 28, 2014.

Bilgin et al. "Higher Order Threshold Implementations", International Conference on the Theory and Application of Cryptology and Information Security, Advances in Cryptology, Asiacrypt 2014, p. 326-43, Dec. 7, 2014.

Brier et al. "Correlation Power Analysis With a Leakage Model", International Workshop on Cryptographic Hardware and Embedded Systems—CHES 2004, p. 16-29, Aug. 11, 2004.

Bucci et al. "A Countermeasure Against Differential Power Analysis Based on Random Delay Insertion", IEEE International Symposium on Circuits and Systems, ISCAS 2005, Kobe, Japan, May 23-26, 2005, 4: 3547-3550, May 23, 2005.

Bucci et al. "A Flip-Flop for the DPA Resistant Three-Phase Dual-Rail Pre-Charge Logic Family", IEEE Transactions on Very Large Scale Integration (VLSI) Systems, 20(11): 2128-2132, Published Online Oct. 6, 2011.

Bucci et al. "Delay-Based Dual-Rail Precharge Logic", IEEE Transactions on Very Large Scale Integration (VLSI) Systems, 19(7): 1147-1153, Published Online Jun. 24, 2011.

Bucci et al. "Three-Phase Dual-Rail Pre-Charge Logic", Proceedings of the 8th International Conference on Cryptographic Hardware and Embedded Systems, CHES 2006, Yokohama, Japan, Oct. 10-13, 2006, p. 232-234, Oct. 10, 2006.

Cao et al. "Mapping Statistical Process Variations Toward Circuit Performances Variability: An Analytical Modeling Approach", IEEE Transactions on Computer-aided Design of Integrated Circuits and Systems, 26(10): 1866-1873, Oct. 2007.

Cevrero et al. "Power-Gated MOS Current Mode Logic (PG-MCML): A Power Aware DPA-Resistant Standard Cell Library", Proceedings of the 48th ACM/EDAC/IEEE Design Automation Conference, DAC 2011, San Diego, CA, USA, Jun. 5-10, 2011, Chap.53.6: 1014-1019, Jun. 5, 2011.

Chabaud et al. "Links Between Differential and Linear Cryptoanalysis", Workshop on the Theory and Application of Cryptographic Techniques, Advances in Cryptology, EUROCRYP'94, 950(Lasec-Conf-1995-001): 356-365, Published Online May 9, 1994.

Chapiro "Globally-Asynchronous Locally-Synchronous Systems", A Dissertation Submitted to the Department of Computer Science and the Committee on Graduate Studies of Stanford University in Partial Fulfillment of the Requirements for the Degree of Doctor of Philosophy, Stanford University, Stanford, CA, USA, p. 1-123, Oct. 1984.

Chen et al. "Power Supply Noise Analysis Methodology for Deep-Submicron VLSI Chip Design", Proceedings of the 34th Annual Design Automation Conference, DAC'97, Anaheim, CA, USA, Jun. 9-13, 1997, 40.3: 638-643, Jun. 9, 1997.

Clavier et al. "Differential Power Analysis in the Presence of Hardware Countermeasures", Proceedings of the 2nd International Workshop on Cryptographic Hardware and Embedded Systems, CHES 2000, Worcester, MA, USA, Aug. 17-18, 2000, p. 252-263, Aug. 17, 2000.

Daemen "The Design of Rijndael: AES—The Advanced Encryption Standard", Springer Science & Bussiness Media, p. 1-238, Nov. 26, 2001.

De Mulder et al. "Practical DPA Attacks on MDPL", First IEEE International Workshop on Information Forensics and Security, WIFS 2009, London, UK, Dec. 6-9, 2009, p. 191-195, Dec. 6, 2009.

Del Pozo et al. "Side-Channel Attacks From Static Power: When Should We Care?", Proceedings of the 2015 Design, Automation & Test in Europe Conference & Exhibition, Date'15, Grenoble, France, Mar. 9-13, 2015, p. 145-150, Mar. 9, 2015.

Evans "Embedded Incomplete Latin Squares", The American Mathematical Monthly, 67(10): 958-961, Dec. 1960.

Gao et al. "Analog Circuit Shielding Routing Algorithm Based on Net Classification", Proceedings of the 16th ACM/IEEE International Symposium on Low Power Electronics and Design, ISPLED'10, Austin, Texas, USA, Aug. 18-20,2010, p. 123-128, Aug. 18, 2010.

Gierlichs et al. "Revisiting Higher-Order DPA Attacks: Multivariate Mutual Information Analysis", Proceedings of the 2010 International Conference on Topics in Cryptology, CT-RSA 2010, San Francisco, CA, USA, Mar. 1-5, 2010, p. 221234, Mar. 1, 2010.

Gierlichs et al. "Statistical and Information-Theoretic Methods for Power Analysis on Embedded Cryptography", Dissertation Presented in Partial Fulfillment of the Requirements for the Degree of Doctor in Engineering, Katholieke Universiteit Leuven, Gelgium, Arenberg Doctoral School of Science, Engineering & Technology, Faculty of Engineering, Department of Electrical Engineering, ESAT, p. 1-161, Jan. 2011.

(56) References Cited

OTHER PUBLICATIONS

Goodwill et al. "A Testing Methogology for Side-Channel Resistance Validation", NIST Non-Invasive Attack Testing Workshop, p. 1-15, 2011.

Gürkaynak et al. "Improving DPA Security by Using Globally-Asynchronous Locally-Synchronous Systems", Proceedings of the 31st European Solid-State Circuits Conference, ESSCIRC 2005, Grenoble, France, Sep. 12-16, 2005, p. 407-410, Sep. 12, 2005.

Heydari et al. "Capacitive Coupling Noise in High-Speed VLSI Circuits", IEEE Transactions on Computer-Aided Design of Integrated Circuits and Systems, 24(3): 478-488, Mar. 2005.

Huffman "The Design and Use of Hazard-Free Switching Networks", Journal of the ACM, JACM, 4(1): 47-62, Jan. 1957.

Hwang et al. "AES-Based Security Coprocessor IC in 0.18-μm CMOS With Resistance to Differential Power Analysis Side-Channel Attacks", IEEE Journal of Solid-state Circuits, 41(4): 781-792, Apr. 2006.

Joye et al. "On Second-Order Differential Power Analysis", Proceedings of the 7th International Conference on Cryptographic Hardware and Embedded Systems, CHES 2005, Edinburgh, UK, Aug. 29-Sep. 1, 2005, LNCS 3659: 293-308, Aug. 29, 2005.

Kamoun et al. "Experimental Implementation of 2ODPA Attacks on AES Design With Flash-Based FPGA Technology", 22nd IEEE International Conference on Microelectronics, IMC 2010, Cairo, Egypt, Dec. 19, 2010, p. 407-410, Dec. 19, 2010.

Kocher et al. "Differential Power Analysis", Proceedings of the 19th Annual International Cryptology Conference on Advances in Cryptology, Crypto'99, Aug. 15-19, 1999, p. 388-397, Aug. 15, 1999.

Kocher et al. "Introduction to Differential Power Analysis", Journal of Cryptographic Engineering, 1(1): 5-27, Published Online Mar. 3, 2011.

Krstic et al. "System Integration by Request-Driven GALS Design", IEE Proceedings-Computers and Digital Techniques, 153(5): 362-372, Sep. 2006.

Levi et al. "Data-Dependent Delays as a Barrier Against Power Attacks", IEEE Transactions on Circuits and Systems I: Regular Papers, 62(8): 2069-2078, Published Online Jul. 24, 2015.

Loder et al. "Towards a Framework to Perform DPA Attack on GALS Pipeline Architectures", Proceedings of the 27th Symposium on Integrated Circuits and Systems Design, SBCCI'14, Aracaju, Brazil, Sep. 1-5, 2014, Art.33: 1-7, Sep. 1, 2014.

Macé et al. "A Dynamic Current Mode Logic to Counteract Power Analysis Attacks", Proceedings of the 19th International Conference on Design of Circuits and Integrated Systems, DCIS 2004, Bordeaux, France, p. 186-191, Nov. 24, 2004.

Mangard et al. "Hardware Countermeasures Against DPA—Statistical Analysis of Their Effectiveness", Topics in Cryptology—CT-RSA 2004, Proceedings of the Cryptographers' Track at the RSA Conference 2004, San Francisco, CA, USA, Feb. 2004, LNCS 2964: 222-235, Feb. 2004.

Mangard et al. "One for All—All for One: Unifying Standard DPA Attacks", IET Information Security, 5(2): 100-111, 2011.

Mangard et al. "Side-Channel Leakage of Masked CMOS Gates", Proceedings of the 2005 International Conference on Topics in Cryptology—CT-RSA 2005, San Francisco, CA, USA, Feb. 14-18, 2005, 3376: 351-365, Feb. 14, 2005.

Mangard et al. "Successfully Attacking Masked AES Hardware Implementations", Proceedings of the 7th International Conference on Cryptographic Hardware and Embedded Systems, CHES 2005, Edinburgh, UK, Aug. 29-Sep. 1, 2005, p. 157-171, Aug. 29, 2005.

Messerges "Using Second-Order Power Analysis to Attack DPA Resistant Software", Proceedings of the 2nd International Workshop on Cryptographic Hardware and Embedded Systems, CHES 2000, Worcester, MA, USA, Aug. 17-18, 2000, LNCS 1965: 238-251, Aug. 17, 2000.

Messerges et al. "Examining Smart-Card Scurity Under the Threat of Power Analysis Attacks", IEEE Transactions on Computers, 51(5): 541-552, May 2002.

Moore et al. "Balanced Self-Checking Asynchronous Logic for Smart Card Applications", Microprocessors and Microsystems, 27(9): 421-430, Oct. 31, 2003.

Moradi et al. "Information Leakage of Flip-Flops in DPA-Resistant Logic Styles", IACR Cryptology ePrint Archive, 2008: 188-1-188-13, 2008.

Moradi et al. "Pushing the Limits: a Very Compact and a Threshold Implementation of AES", Annual International Conference on the Theory and Applications of Cryotpgraphic Techniques, LNCS, 6632: 69-88, May 2011.

Muttersbach et al. "Practical Design of Globally-Asynchronous Locally- Synchronous Systems", Proceedings of the 6th International Symposium on Advanced Research in Asynchronous Circuits and Systems, ASYNC 2000, Eilat, Israel, Apr. 2-6, 2000, p. 52-59, Apr. 2, 2000.

Naccache et al. "Cryptographic Smart Cards", IEEE Micro, 16(3): 14, 16-24, Jun. 1996.

Oswald et al. "Practical Second-Order DPA Attacks for Masked Smart Card Implementations of Block Ciphers", Proceedings of the 2006 the Cryptographers' Track at the RSA Conference on Topics in Cryptology, CT-RSA 2006, San Jose, CA, USA, Feb. 13-17, 2006, p. 192-207, Feb. 13, 2006.

Peeters et al. "Improved Higher-Order Side-Channel Attacks With FPGA Experiments", Proceedings of the 7th International Conference on Cryptographic Hardware and Embedded System, CHES 2005, Edinburgh, UK, Aug. 29-Sep. 1, 2005, p. 309-323, Aug. 29, 2005.

Popp et al. "Evaluation of the Masked Logic Style MDPL on a Prototype Chip", Proceedings of the 9th International Workshop on Cryptographic Hardware and Embedded Systems, CHES'07, Vienna, Austria, Sep. 10-13, 2007, p. 81-94, Sep. 10, 2007.

Popp et al. "Implementation Aspects of the DPA-Resistant Logic Style MDPL", Proceedings of the 2006 IEEE International Symposium on Circuits and Systems, ISCAS 2006, Island of Kos, Greece, May 21-24, 2006, p. 2913-2916, May 21, 2006.

Saha "Modeling Process Variability in Scaled CMOS Technology", IEEE Design & Test of Computers, 27(2): 8-16, Mar. 18, 2010.

Schramm et al. "Higher Order Masking of the AES", Proceedings of the 2006 the Cryptographers' Track at the RSA Conference on Topics in Cryptology, CT-RSA 2006, San Jose, CA, USA, Feb. 13-17, 2006, p. 208-225, Feb. 13, 2006.

Shang et al. "High-Security Asynchronous Circuit Implementaiton of AES", IEE Proceedings-Computers and Digital Techniques, 153(2): 71-77, Mar. 6, 2006.

Sharma et al. "Signal Integrity and Propagation Delay Analysis Using FDTD Technique for VLSI Interconnects", Journal of Computational Electronics, 13(1): 300-306, Published Online Nov. 9, 2013.

Sokolov et al. "Design and Analysis of Dual-Rail Circuits for Security Applications", IEEE Transactions on Computers, 54(4): 449-460, Published Online Feb. 15, 2005.

Sokolov et al. "Improving the Security of Dual-Rail Circuits (Revision 2)", School of Electrical, Electronic & Computer Engineering, University of Newcastle Upon Tyne, UK, Technical Report Series, NCL-EECE-MSD-TR-2004-101-Rev.2, p. 1-22, Jan. 2004.

Standaert et al. "A Unified Framework for the Analysis of Side-Channel Key Recovery Attacks", Proceedings of the 28th Annual International Conference on the Theory and applications of Cryptographic Techniques - Advances in Cryptology, Eurocrypt 2009. Cologne, Germany, Apr. 26-30, 2009, LNCS 5459: 443-461, Apr. 26, 2009.

Stojanovic et al. "Comparative Analysis of Master-Slave Lathces and Flip-Flops for High-Performance and Low-Power Systems", IEEE Journal of Solid-State Circuits, 34(4): 536-548, Apr. 1999.

Suzuki et al. "Security Evaluation of DPA Countermeasures Using Dual-Rail Pre- Charge Logic Style", Proceedings of the 8th International Conference on Cryptographic Hardware and Embedded Systems, CHES 2006, Yokohama, Japan, Oct. 10-13, 2006, p. 255-269, Oct. 10, 2006.

Tiri et al. "A Logic Level Design Methodology for a Secure DPA Resistant ASIC or FPGA Implementation", Proceedings of the Conference on Design, Automation and Test in Europe, Date'04, Paris, France, Feb. 16-20, 2004, 1: 10246-1-10246-6, Feb. 16, 2004.

(56) References Cited

OTHER PUBLICATIONS

Tiri et al. "Charge Recycling Sense Amplifier Based Logic: Securing Low Power Security IC's Against DPA", Proceedings of the 30th European Solid-State Circuits Conference, ESSCIRC'04, Leuwen, Belgium, Sep. 23, 2004, p. 179-182, Sep. 23, 2004.
Triantis et al. "Thermal Noise Modeling for Short-Channel MOSFET's", IEEE Transactions on Electron Devices, 43(11): 1950-1955, Nov. 1996.
Vaquie et al. "Secure D Flip-Flop Against Side Channel Attacks", IET Circuits, Devices & Systems, 6(5): 347-354, Sep. 2012.
Waddle etal. "Towards Efficient Second-Order Power Analysis", International Workshop on Cryptographic Hardware and Embedded Systems, CHES 2004, Cambridge, MA, USA, Aug. 11-13, 2004, 6(3156): 1-15, Aug. 2004.
Welch "The Generalization of 'Student's' Problem When Several Different Population Variances Are Involved", Biometrika, 34(1/2): 28-35, Jan. 1947.
Wu et al. "Measurement and Evaluation of Power Analysis Attacks on Asynchronous S-Box", IEEE Transactions on Instrumentation and Measurment, 61(10): 2765-2775, Published Online Jun. 11, 2012.
Xu et al. "Timing Uncertainty in 3-D Clock Trees Due to Process Variations and Power Supply Noise", IEEE Transactions on Very Large Scale Integration (VLSI) Systems, 21(12): 2226-2239, Published Online Jan. 11, 2013.
Yang et al. "Power Attack Resistant Cryptosystem Design: a Dynamic Voltage and Frequency Switching Approach", Proceedings of the Design, Automation and Test in Europe Conference and Exhibition, Date'05, Munich, Germany, Mar. 7-11, 2005, 3: 64-69, Mar. 7, 2005.
Das et al. "High Efficiency Power Side-Channel Attack Immunity Using Noise Injection in Attenuated Signature Domain", 2017 IEEE International Symposium on Hardware Oriented Security and Trust, HOST, McLean, VA, USA, May 1-5, 2017, p. 62-67, May 1, 2017.
Güneysu et al. "Generic Side-Channel Countermeasures for Reconfigurable Devices", Proceedings of the 13th International Workshop on Cryptographic Hardware and Embedded Systems, CHES'11, Nara, Japan, Sep. 28-Oct. 1, 2011, p. 33-48, Sep. 28, 2011.
Ratanpul et al. "An On-Chip Signal Suppression Countermeasure to Power Analysis Attacks", IEEE Transactions on Dependable and Secure Computer, 1(3): 179-189, Jul.-Sep. 2004.
Shamir "Protecting Smart Cards From Passive Power Analysis With Detached Power Supplies", Proceedings of the Second International Workshop on Cryptographic Hardware and Embedded Systems, CHES '00, Worcester, MA, USA, Aug. 17-18, 2000, LNCS 1965: 71-77, Aug. 17, 2000.
Tokunaga et al. "Securing Encryption Systems With a Switched Capacitor Current Equalizer", IEEE Journal of Solid-State Circuites, 45(1): 23-31, Published Online Dec. 23, 2009.
Wang et al. "Role of Power Grid in Side Channel Attack and Power-Grid-Aware Secure Design", Proceedings of the 50th Annual Design Automation Conference, DAC'13, Austin, TX, USA, May 29-Jun. 7, 2013, Art.78: 1-9, May 29, 2013.
International Preliminary Report on Patentability dated Jan. 10, 2018 From the International Bureau of WIPO Re. Application No. PCT/IL2017/050727. (5 Pages).
International Preliminary Report on Patentability dated Jan. 10, 2019 From the International Bureau of WIPO Re. Application No. PCT/IL2017/050732. (5 Pages).
International Search Report and the Written Opinion dated Sep. 25, 2017 From the International Searching Authority Re. Application No. PCT/IL2017/050732. (9 Pages).
Gornik et al. "A Hardware-Based Countermeasure to Reduce Side-Channel Leakage: Design, Implementation, and Evaluation", IEEE Transactions on Computer-Aided Design on Integrated Circuits and Systems, 34(8): 1308-1319, Published Online Apr. 16, 2015.
Mayhew "Design of an On-Chip Power Analysis Attack Countermeasure Incorporating a Randomized Switch Box", A Thesis Presented in Partial Fulfilment of Requirements for the Degree of Doctor of Philosophy in Engineering, University of Guelph, Ontario, Canada, p. 1-242, Apr. 2016.
International Search Report and the Written Opinion dated Oct. 16, 2017 From the International Searching Authority Re. Application No. PCT/IL2017/050727. (11 Pages).
Du et al. "Multi-Core Architecture With Asynchronous Clocks to Prevent Power Analysis Attacks", IEICE Electronics Express, 14(4):20161220-1-20161220-10, Published Online Feb. 9, 2017. Abstract, Sections 1, 2.
International Search Report and the Written Opinion dated May 30, 2019 From the International Searching Authority Re. Application No. PCT/IL2019/050230. (9 Pages).
Official Action dated Jul. 10, 2019 From the US Patent and Trademark Office Re. U.S. Appl. No. 13/312,317. (40 Pages).

\* cited by examiner

Original

| $L^{(j=1)}$ | output | 0 | 1 | 2 | 3 | 4 |
|---|---|---|---|---|---|---|
| 3 | $Set_3$ |  | 5 | 8 | 6 | 4 |
| 2 | $Set_1$ | 5 | 6 | 4 | 7 | 8 |
| 1 | $Set_2$ |  | 8 | 6 |  | 7 |
| 1 | $Set_4$ |  | 7 | 5 | 4 |  |
| 1 | $Set_5$ |  | 4 | 7 | 8 | 6 |

Fig. 17A j=1

| $L^{(j=1)}$ | output | 0 | 1 | 2 | 3 | 4 | |
|---|---|---|---|---|---|---|---|
| 1 | $Set_3$ |  | 5 | 8 | 6 | 4 | |
| 1 | $Set_1$ | 5 | 6 | 4 | 7 | 8 | |
| 1 | $Set_2$ |  | 8 | 6 |  | 7 | |
| 1 | $Set_4$ |  | 7 | 5 | 4 |  | |
| 1 | $Set_5$ |  | 4 | 7 | 8 | 6 | |
| 2 | $Set_{3\_1}$ |  | 5→10 |  | 6→11 |  | B |
| 1 | $Set_{1\_1}$ |  |  | 4→9 | 7→12 |  | |

Fig. 17B

| $L^{(j=2)}$ | output | 0 | 1 | 2 | 3 | 4 | |
|---|---|---|---|---|---|---|---|
| 1 | $Set_{3\_1}$ |  | 10 |  | 11 |  | A |
| 1 | $Set_1$ | 5 | 6 | 4 | 7 | 8 | |
| 1 | $Set_2$ |  | 8 | 6 |  | 7 | |
| 1 | $Set_4$ |  | 7 | 5 | 4 |  | |
| 1 | $Set_5$ |  | 4 | 7 | 8 | 6 | |
| 1 | $Set_3$ |  | 5 | 8 | 6 | 4 | |
| 1 | $Set_{1\_1}$ |  |  | 9 | 12 |  | |
| 1 | $Set_{1\_2}$ |  | 10→13 |  | 11→14 |  | B |

Fig. 17C

DATA-DEPENDENT DELAY CIRCUITS

RELATED APPLICATION

This application claims the benefit of priority under 35 USC 119(e) of U.S. Provisional Patent Application No. 62/367,672 filed on Jul. 28, 2016, the contents of which are incorporated herein by reference in their entirety.

FIELD AND BACKGROUND OF THE INVENTION

The present invention, in some embodiments thereof, relates to mitigating side channel attacks on logic circuits, and, more particularly, but not exclusively, to a logic circuit design to mitigate power analysis attacks.

Electronic devices such as smart cards and radio frequency identification (RFID) tags contain private or secret information. This information is usually protected by cryptographic algorithms that run on a dedicated crypto core. Cryptographic algorithms protect the information from eavesdropper adversaries but leave it assailable to side channel attacks. Side channel attacks are based on the observation that the hardware leaks information. One of the most powerful side channel attacks is a power analysis (PA) attack. Power analysis attacks may be carried out with fairly low-cost equipment and their computational complexity is relatively low.

A power analysis attack is based on statistical tests on two sets of variables: the measured power supply current, and the hypothesized power supply current. The hypothesized power supply current is calculated for each possible secret key. The key with the highest probability is assumed to be the correct one. To do so, the attacker must model the dissipated current as a function of the circuit's functionality and its inputs. Typically, it is assumed that the current is proportional to the Hamming weight of the output (or to the Hamming distance between two successive logical outputs).

In practice, the output bits are not computed simultaneously or instantaneously. The computation of each output bit depends on several factors including the input slopes, transistor/gate sizing along the data-propagation path, routing capacitance and resistance, thermal noise and voltage fluctuations. As a result, the propagation delay is data-dependent. In turn, there is Intra-Cycle information leakage.

Countermeasures against security threats may be embedded in cryptographic cores at all abstraction levels (i.e., circuit/gate, combinatorial block, architecture and algorithm). Countermeasures at the circuit level are divided into two types: countermeasures that aim to randomize the consumed power and countermeasures that aim to flatten the energy consumption per cycle. Countermeasures that randomize the power profile include gate level masking, Random pre-charge Logic RPL, Random delay Insertion RDI and gate level randomization—Random Multi Topology Logic RMTL. Countermeasures at the circuit level, such as Dual-rail logic based: Sense Amplifier Based Logic, SABL, Charge Recycling SABL, CRSABL, Dual Spacer Dual Rail, DSDR, Delay Based Dual Rail, DDPL, Three Phase Dual Rail, TDPL, Wave Dynamic and Differential, WDDL, Divided WDDL, DWDDL and Dynamic Current Mode Logic, DyCML, are embedded in the combinatorial part of the system. These countermeasures aim to consume constant energy per cycle and have been shown to be sensitive to process mismatch, hazards, coupling capacitances, process variations, noise, delay imbalance, etc. These non-idealities make almost all previously proposed countermeasures vulnerable to revealing secret data.

Additional background art includes:

[1] S. Mangard, E. Oswald, and T. Popp, *Power Analysis Attacks: Revealing the Secrets of Smart Cards.* Springer, 2008.

[2] T. S. Messerges, E. A. Dabbish, and R. H. Sloan, "Examining smart-card security under the threat of power analysis attacks," *IEEE Trans. Comput.*, vol. 51, no. 5, pp. 541-552, May 2002.

[3] D. Naccache and D. M'Raihi, "Cryptographic smart cards," *IEEE Micro*, vol. 16, no. 3, pp. 14, 16-24, June 1996.

[4] L. Batina, J. Guajardo, T. Kerins, N. Mentens, P. Tuyls, and I. Verbauwhede, "Public-Key Cryptography for RFID-Tags," in *Fifth Annual IEEE International Conference on Pervasive Computing and Communications Workshops, 2007. PerCom Workshops '07*, 2007, pp. 217-222.

[5] P. Kocher, J. Jaffe, B. Jun, and P. Rohatgi, "Introduction to differential power analysis," *J. Cryptogr. Eng.*, vol. 1, no. 1, pp. 5-27, April 2011.

[6] E. Brier, C. Clavier, and F. Olivier, "Correlation Power Analysis with a Leakage Model," in *Cryptographic Hardware and Embedded Systems—CHES 2004*, M. Joye and J.-J. Quisquater, Eds. Springer Berlin Heidelberg, 2004, pp. 16-29.

[7] P. Kocher, J. Jaffe, and B. Jun, "Differential Power Analysis," in *Advances in Cryptology—CRYPTO '99*, M. Wiener, Ed. Springer Berlin Heidelberg, 1999, pp. 388-397.

[8] S. Mangard, T. Popp, and B. M. Gammel, "Side-Channel Leakage of Masked CMOS Gates," in *Topics in Cryptology—CT-RSA 2005*, A. Menezes, Ed. Springer Berlin Heidelberg, 2005, pp. 351-365.

[9] D. P. Triantis, A. N. Birbas, and D. Kondis, "Thermal noise modeling for short-channel MOSFETs," *IEEE Trans. Electron Devices*, vol. 43, no. 11, pp. 1950-1955, November 1996.

[10] S. K. Saha, "Modeling Process Variability in Scaled CMOS Technology," *IEEE Design & Test of Computers*, vol. 27, no. 2, pp. 8-16, 2010.

[11] T. Popp, M. Kirschbaum, T. Zefferer, and S. Mangard, "Evaluation of the Masked Logic Style MDPL on a Prototype Chip," in *Cryptographic Hardware and Embedded Systems—CHES 2007*, P. Paillier and I. Verbauwhede, Eds. Springer Berlin Heidelberg, 2007, pp. 81-94.

[12] E. De Mulder, B. Gierlichs, B. Preneel, and I. Verbauwhede, "Practical DPA attacks on MDPL," in *First IEEE International Workshop on Information Forensics and Security, 2009. WIFS 2009*, 2009, pp. 191-195.

[13] A. Moradi, M. Salmasizadeh, and M. T. M. Shalmani, "Power Analysis Attacks on MDPL and DRSL Implementations," in *Information Security and Cryptology—ICISC 2007*, K.-H. Nam and G. Rhee, Eds. Springer Berlin Heidelberg, 2007, pp. 259-272.

[14] T. Popp and S. Mangard, "Implementation aspects of the DPA-resistant logic style MDPL," in *2006 IEEE International Symposium on Circuits and Systems, 2006. ISCAS 2006. Proceedings*, 2006, p. 4 pp.-2916.

[15] M. Bucci, M. Guglielmo, R. Luzzi, and A. Trifiletti, "A Power Consumption Randomization Countermeasure for DPA-Resistant Cryptographic Processors," in *Integrated Circuit and System Design. Power and Timing Modeling, Optimization and Simulation*, E. Macii, V. Paliouras, and O. Koufopavlou, Eds. Springer Berlin Heidelberg, 2004, pp. 481-490.

[16] M. Bucci, R. Luzzi, M. Guglielmo, and A. Trifiletti, "A countermeasure against differential power analysis based on random delay insertion," in *IEEE International Symposium on Circuits and Systems, 2005. ISCAS 2005*, 2005, pp. 3547-3550 Vol. 4.

[17] M. Avital, H. Dagan, O. Keren, and A. Fish, "Randomized Multitopology Logic Against Differential Power Analysis," *IEEE Trans. Very Large Scale Integr. VLSI Syst.*, vol. Early Access Online, 2014.

[18] K. Tiri and I. Verbauwhede, "A Logic Level Design Methodology for a Secure DPA Resistant ASIC or FPGA Implementation," in *Proceedings of the Conference on Design, Automation and Test in Europe—Volume 1*, Washington, D.C., USA, 2004, p. 10246-.

[19] K. Tiri and I. Verbauwhede, "Charge recycling sense amplifier based logic: securing low power security ICs against DPA [differential power analysis]," in *Solid-State Circuits Conference, 2004. ESSCIRC 2004. Proceeding of the 30th European*, 2004, pp. 179-182.

[20] D. Sokolov, J. Murphy, A. Bystrov, and A. Yakovlev, "Design and analysis of dual-rail circuits for security applications," *IEEE Trans. Comput.*, vol. 54, no. 4, pp. 449-460, April 2005.

[21] D. Sokolov, J. Murphy, A. Bystrov, and A. Yakovlev, "Improving the Security of Dual-Rail Circuits," in *Cryptographic Hardware and Embedded Systems—CHES 2004*, M. Joye and J.-J. Quisquater, Eds. Springer Berlin Heidelberg, 2004, pp. 282-297.

[22] M. Bucci, L. Giancane, R. Luzzi, G. Scotti, and A. Trifiletti, "Delay-Based Dual-Rail Precharge Logic," *IEEE Trans. Very Large Scale Integr. VLSI Syst.*, vol. 19, no. 7, pp. 1147-1153, July 2011.

[23] M. Bucci, L. Giancane, R. Luzzi, and A. Trifiletti, "Three-Phase Dual-Rail Pre-charge Logic," in *Cryptographic Hardware and Embedded Systems—CHES 2006*, L. Goubin and M. Matsui, Eds. Springer Berlin Heidelberg, 2006, pp. 232-241.

[24] M. Bucci, L. Giancane, R. Luzzi, and A. Trifiletti, "A Flip-flop for the DPA Resistant Three-phase Dual-rail Precharge Logic Family," *IEEE Trans Very Large Scale Integr Syst*, vol. 20, no. 11, pp. 2128-2132, November 2012.

[25] D. D. Hwang, K. Tiri, A. Hodjat, B.-C. Lai, S. Yang, P. Schaumont, and I. Verbauwhede, "AES-Based Security Coprocessor IC in 0.18—CMOS With Resistance to Differential Power Analysis Side-Channel Attacks," *IEEE J. Solid-State Circuits*, vol. 41, no. 4, pp. 781-792, April 2006.

[26] F. Mace, I. Hassoune, and others, "A Dynamic Current Mode Logic to Counteract Power Analysis Attacks," in *In The Proceedings of DCIS 2004*, 2004.

[27] S. Mangard, N. Pramstaller, and E. Oswald, "Successfully Attacking Masked AES Hardware Implementations," in *Cryptographic Hardware and Embedded Systems—CHES 2005*, J. R. Rao and B. Sunar, Eds. Springer Berlin Heidelberg, 2005, pp. 157-171.

[28] D. K. Sharma, B. K. Kaushik, and R. K. Sharma, "Signal integrity and propagation delay analysis using FDTD technique for VLSI interconnects," *J. Comput. Electron.*, vol. 13, no. 1, pp. 300-306, March 2014.

[29] P. Heydari and M. Pedram, "Capacitive coupling noise in high-speed VLSI circuits," *IEEE Trans. Comput.-Aided Des. Integr. Circuits Syst.*, vol. 24, no. 3, pp. 478-488, March 2005.

[30] H. Xu, V. F. Pavlidis, X. Tang, W. Burleson, and G. De Micheli, "Timing Uncertainty in 3-D Clock Trees Due to Process Variations and Power Supply Noise," *IEEE Trans. Very Large Scale Integr. VLSI Syst.*, vol. 21, no. 12, pp. 2226-2239, December 2013.

[31] H. H. Chen and D. D. Ling, "Power Supply Noise Analysis Methodology for Deep-submicron VLSI Chip Design," in *Proceedings of the 34th Annual Design Automation Conference*, New York, N.Y., USA, 1997, pp. 638-643.

[32] C. Clavier, J.-S. Coron, and N. Dabbous, "Differential Power Analysis in the Presence of Hardware Countermeasures," in *Cryptographic Hardware and Embedded Systems—CHES 2000*, Ç. K. Koç and C. Paar, Eds. Springer Berlin Heidelberg, 2000, pp. 252-263.

[33] S. Mangard, "Hardware Countermeasures against DPA—A Statistical Analysis of Their Effectiveness," in *Topics in Cryptology—CT-RSA 2004*, T. Okamoto, Ed. Springer Berlin Heidelberg, 2004, pp. 222-235.

[34] J. Daemen and V. Rijmen, *The Design of Rijndael: AES—The Advanced Encryption Standard*. Springer Science & Business Media, 2002.

[35] E. Biham and A. Shamir, "Differential Cryptanalysis of DES Variants," in *Differential Cryptanalysis of the Data Encryption Standard*, Springer New York, 1993, pp. 33-77.

[36] F. Chabaud and S. Vaudenay, "Links between differential and linear cryptanalysis," in *Advances in Cryptology—EUROCRYPT '94*, A. D. Santis, Ed. Springer Berlin Heidelberg, 1995, pp. 356-365.

[37] F. E. Croxton and D. J. Cowden, *Applied general statistics*, vol. xviii. New York, N.Y., US: Prentice-Hall, Inc, 1939.

[38] M. Alioto, M. Poli, and S. Rocchi, "A General Power Model of Differential Power Analysis Attacks to Static Logic Circuits," *IEEE Trans. Very Large Scale Integr. VLSI Syst.*, vol. 18, no. 5, pp. 711-724, May 2010.

[39] Y. Cao and L. T. Clark, "Mapping Statistical Process Variations Toward Circuit Performance Variability: An Analytical Modeling Approach," *IEEE Trans. Comput.-Aided Des. Integr. Circuits Syst.*, vol. 26, no. 10, pp. 1866-1873, October 2007.

[40] Q. Gao, Y. Shen, Y. Cai, and H. Yao, "Analog Circuit Shielding Routing Algorithm Based on Net Classification," in *Proceedings of the 16th ACM/IEEE International Symposium on Low Power Electronics and Design*, New York, N.Y., USA, 2010, pp. 123-128.

[41] D. A. Huffman, "The Design and Use of Hazard-Free Switching Networks," *J ACM*, vol. 4, no. 1, pp. 47-62, January 1957.

[42] R. Arunachalam, R. D. Blanton, and L. T. Pileggi, "False Coupling Interactions in Static Timing Analysis," in *Proceedings of the 38th Annual Design Automation Conference*, New York, N.Y., USA, 2001, pp. 726-731.

[43] J. M. Rabaey, "Digital Integrated Circuits: A Design Perspective".

[44] K. Baddam and M. Zwolinski, "Divided Backend Duplication Methodology for Balanced Dual Rail Routing," in *Cryptographic Hardware and Embedded Systems—CHES 2008*, E. Oswald and P. Rohatgi, Eds. Springer Berlin Heidelberg, 2008, pp. 396-410.

[45] D. Suzuki and M. Saeki, "Security Evaluation of DPA Countermeasures Using Dual-Rail Pre-charge Logic Style," in *Cryptographic Hardware and Embedded Systems—CHES 2006*, L. Goubin and M. Matsui, Eds. Springer Berlin Heidelberg, 2006, pp. 255-269.

[46] "The International Technology Roadmap for Semiconductors," ITRS website. Available: http://public(dot)itrs(dot)net

[47] F.-X. Standaert, T. G. Malkin, and M. Yung, "A unified framework for the analysis of side-channel key recovery attacks," in *Advances in Cryptology—EUROCRYPT 2009*, Springer, 2009, pp. 443-461.

[48] S. Mangard, E. Oswald, and F.-X. Standaert, "One for all—all for one: unifying standard differential power analysis attacks," IET Information Security, vol. 5, no. 2, p. 100, 2011.

[49] A. Moradi, T. Eisenbarth, A. Poschmann, C. Rolfes, C. Paar, M. T. M. Shalmani, and M. Salmasizadeh, "Information Leakage of Flip-Flops in DPA-Resistant Logic Styles," IACR Cryptology ePrint Archive, vol. 2008, p. 188, 2008.

[50] B. Vaquie, S. Tiran, and P. Maurine, "Secure D flip-flop against side channel attacks," IET Circuits, Devices Systems, vol. 6, no. 5, pp. 347-354, September 2012.

[51] T. Evans, "Embedding incomplete latin squares", Amer. Math. Monthly, 67 (1960), pp. 959-961.

[52] J. Balasch, B. Gierlichs, V. Grosso, O. Reparaz, and F.-X. Standaert, "On the Cost of Lazy Engineering for Masked Software Implementations," in Smart Card Research and Advanced Applications, M. Joye and A. Moradi, Eds. Springer International Publishing, 2014, pp. 64-81.

[53] J. Waddle and D. Wagner, "Towards Efficient Second-Order Power Analysis," in Cryptographic Hardware and Embedded Systems—CHES 2004, M. Joye and J.-J. Quisquater, Eds. Springer Berlin Heidelberg, 2004, pp. 1-15.

[54] K. Schramm and C. Paar, "Higher Order Masking of the AES," in Topics in Cryptology—CT-RSA 2006, D. Pointcheval, Ed. Springer Berlin Heidelberg, 2006, pp. 208-225.

[55] B. Gierlichs, L. Batina, B. Preneel, and I. Verbauwhede, "Revisiting Higher-Order DPA Attacks:" in Topics in Cryptology—CT-RSA 2010, J. Pieprzyk, Ed. Springer, 2010, pp. 221-234.

[56] E. Peeters, F.-X. Standaert, N. Donckers, and J.-J. Quisquater, "Improved Higher-Order Side-Channel Attacks with FPGA Experiments," in Cryptographic Hardware and Embedded Systems—CHES 2005, J. R. Rao and B. Sunar, Eds. Springer, 2005.

[57] M. Joye, P. Paillier, and B. Schoenmakers, "On Second-Order Differential Power Analysis," in Cryptographic Hardware and Embedded Systems—CHES 2005, J. R. Rao and B. Sunar, Eds. Springer Berlin Heidelberg, 2005, pp. 293-308.

[58] N. M. Kamoun, L. Bossuet, and A. Ghazel, "Experimental implementation of 2ODPA attacks on AES design with flash-based FPGA technology," in 2010 International Conference on Microelectronics (ICM), 2010, pp. 407-410.

[59] T. S. Messerges, "Using Second-Order Power Analysis to Attack DPA Resistant Software," in Cryptographic Hardware and Embedded Systems—CHES 2000, ç. K. Koç and C. Paar, Eds. Springer Berlin Heidelberg, 2000, pp. 238-251.

[60] B. Bilgin, B. Gierlichs, S. Nikova, V. Nikov, and V. Rijmen, "Higher-Order Threshold Implementations," in Advances in Cryptology—ASIACRYPT 2014, P. Sarkar and T. Iwata, Eds. Springer Berlin Heidelberg, 2014, pp. 326-343.

[61] E. Oswald, S. Mangard, C. Herbst, and S. Tillich, "Practical Second-Order DPA Attacks for Masked Smart Card Implementations of Block Ciphers," in *Topics in Cryptology—CT-RSA* 2006, D. Pointcheval, Ed. Springer Berlin Heidelberg, 2006, pp. 192-207.

SUMMARY OF THE INVENTION

Embodiments of the invention insert data-dependent delays into the circuit layout as a barrier to PA attacks. Data-dependent effects are considered as noise in the eyes of the attacker and are used as a source of randomness to assist in resisting power attacks.

According to an aspect of some embodiments of the present invention there is provided a method of designing a logic circuit with data-dependent delays. The logic circuit includes multiple logic paths from logic inputs to at least one logic output. The method includes:

using an electronic design automation system:
obtaining an initial circuit design;
specifying respective delays for multiple logic paths in the initial circuit design such that at least some of the outputs switch at different times within a clock cycle for different combinations of logic input levels; and
forming a second circuit design having the respective delays along the respective logic paths by adding delay elements to the initial circuit design based on the specified respective delays.

According to some embodiments of the invention, the method further includes:

for at least one of the logic paths, calculating a respective initial delay for a logic path by analyzing the initial circuit design; and based on the initial delay, calculating a number of delay elements required for insertion into the logic path to obtain the respective delay specified for the logic path.

According to some embodiments of the invention, the method further includes:

analyzing a power utilization spread of the second circuit design;

calculating an attainable power utilization spread of the initial circuit design; and when the power utilization spread of the second circuit design is less than the attainable power utilization spread, changing at least one of the delays to form a third circuit design having a greater power utilization spread.

According to some embodiments of the invention, forming a second circuit design includes:

selecting locations in logic paths of the initial circuit design for embedding delay elements to obtain the specified respective delays along the logic paths; and embedding the delay elements into the selected locations.

According to some embodiments of the invention, wherein at least one of the delay elements is:
a buffer;
a combination of buffers;
a logic gate;
a combination of logic gates;
a wire;
a resistive element;
a capacitive element; and
a connection between logic gates.

According to some embodiments of the invention, delay elements are added by at least one of:
inserting a resistive element into the initial design;
inserting a capacitive element into the initial design;
adjusting cell sizing;
adjusting circuit layout; and
tuning driving strength.

According to some embodiments of the invention, the specified respective delays create intra-cycle delays within a single output for different combinations of logic input levels.

According to some embodiments of the invention, the specified respective delays create intra-cycle delays amongst the outputs for different combinations of logic input levels.

According to some embodiments of the invention, the specified respective delays create, for different combinations of logic input levels, intra-cycle delays within at least one single output and amongst multiple the outputs.

According to some embodiments of the invention, the method further includes adjusting the second circuit design to reduce a maximal number of delay elements respectively added to the logic paths.

According to some embodiments of the invention, the method further includes adjusting the second circuit design to reduce a respective difference between a maximal and minimal number of delay elements assigned to logic paths within each logic cone from the logic inputs to the logic outputs, and to reduce a respective difference between a maximal and minimal number of delay elements assigned to logic paths in which switching activity occurs simultaneously at different outputs.

According to some embodiments of the invention, specifying the respective delays includes:

partitioning the logic paths into groups, at least one of the groups including multiple logic paths in which switching activity occurs simultaneously at different outputs; and for at least one of the groups, assigning different respective delays to logic paths within the group.

According to some embodiments of the invention, specifying the respective delays includes:

identifying sets of inputs with correlated switching times for multiple outputs; and for at least one of the sets of inputs, assigning different respective delays to logic paths from inputs in the set to the outputs with correlated switching.

According to some embodiments of the invention, specifying the respective delays includes assigning a respective common delay to all logic paths to a single output, wherein the respective common delays are different for at least some of the outputs.

According to some embodiments of the invention, specifying the respective delays includes assigning different respective delays to at least some logic paths to a single output.

According to some embodiments of the invention, for at least some of the logic paths, the number of delay elements added to the logic path is randomly selected from a specified range.

According to some embodiments of the invention, the logic circuit includes a logic cone having multiple logic paths from the inputs to a single output, and specifying the respective delays includes:

forming a delay vector, a length of the delay vector equaling at least a number of the logic paths in the logic cone, each element of the delay vector specifying a number of delay elements;

forming a set of permutations of the delay vector;

randomly selecting one of the permutations;

for each of the logic paths forming the logic cone, adding a number of delay elements given by a respective element of the selected permutation.

According to some embodiments of the invention, specifying the respective delays includes:

partitioning the logic paths into groups, at least one of the groups including multiple logic paths in which switching activity will occur simultaneously at different outputs;

generating a mates matrix, each row of the matrix corresponding to a respective one of the groups, each column of the matrix corresponding to a respective one of the outputs, wherein each cell of the matrix specifies a path from the respective group to the respective output;

for each row of the mates matrix, assigning a different respective number of delay elements to each path in the row;

for each column of the mates matrix, assigning a different respective number of delay elements to each path in the column; and calculating a respective number of delay elements to add to each of the logic paths to conform to the mates matrix.

According to some embodiments of the invention, the method further includes reducing a difference between a maximal and a minimal number of delay elements assigned to each of the rows and a difference between a maximal and a minimal number of delay elements assigned to each of the columns to the smallest possible numbers.

According to some embodiments of the invention, the method further includes reducing a maximal number of delay elements assigned to the cells to a smallest possible number.

According to some embodiments of the invention, the method further includes adjusting the second circuit design to reduce resource costs for embedding the delay elements in the logic paths to obtain the specified respective delays.

According to some embodiments of the invention, the resource costs include at least one of:

circuit area;

circuit power consumption; and a total number of delay elements added to the logic circuit.

According to some embodiments of the invention, the logic circuit includes multiple logic cones from the logic inputs to the logic outputs and the specifying is performed independently for each logic cone.

According to some embodiments of the invention, the logic paths form disjoint logic cones to the outputs.

According to some embodiments of the invention, at least two logic cones formed by the logic paths to the outputs have a common logic gate, and the specified respective delays create, for different combinations of logic input levels, intra-cycle delays within at least one single output and amongst multiple outputs.

According to some embodiments of the invention, obtaining the initial circuit design includes:

defining the logic circuit with a hardware description language (HDL); and synthesizing the HDL definition into an initial netlist representing the initial circuit design.

According to some embodiments of the invention, forming the second circuit design includes adding the specified respective delays into the initial netlist to create a second netlist representing the second circuit design.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 14 illustrates Up and Down-stream assignment for an A matrix without unused cells, according to an exemplary embodiment of the invention;

FIG. 15 illustrates Up and Down-stream assignment for a mates matrix with unused cells, according to an exemplary embodiment of the invention;

FIGS. 17A-17C are examples of an MD design A matrix with joint rows 1 and 2, according to an exemplary embodiment of the invention;

DESCRIPTION OF SPECIFIC EMBODIMENTS OF THE INVENTION

Figure 1:
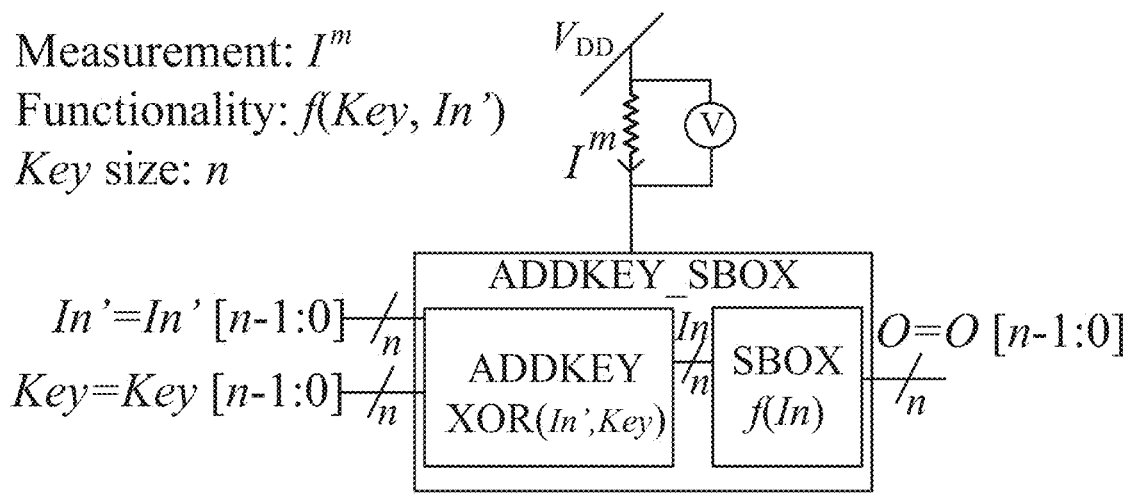
FIG. 1 is a simplified block diagram illustrating an exemplary ADDKEY_SBOX structure.

The present invention, in some embodiments thereof, relates to mitigating side channel attacks on logic circuits, and, more particularly, but not exclusively, to a logic circuit design to mitigate power analysis attacks.

First and high order power analysis attacks are a severe threat to cryptographic core security. However, when properly designed, data-dependent delays can be used as a barrier to these attacks. Embodiments presented herein provide a security oriented delay assignment method for mitigating Single and Multi-Bit attacks. The method enables a reduction of the correlation between the processed data and the consumed current by utilizing the data-dependent delays as a source of correlated noise. The method is suitable for joint/disjoint architectures and symmetrical/non-symmetrical designs. It minimizes the propagation time, power and area overhead by using the inherent delay of the logic structure.

I. Power Analysis Attacks

Power analysis attacks rely on the observation that the dissipated current is correlated with the processed data. It is assumed that at some point in time there is a correlation between the current consumption and the logic value on the output wires. This assumption governs the attack procedure and the formulation of the attack success criterion.

Some analyses presented herein focus on Correlation Power Analysis (CPA). However, embodiments and results are applicable to other statistical PA methods, e.g., differential power analysis (DPA), since there is no substantial difference between the statistical properties of DPA to CPA.

For ease of presentation, we introduce a power attack on a simplified module that is based on a cryptographic n-bit SBOX. The ADDKEY_SBOX module shown in FIG. 1 consists of two blocks: a network of XOR gates that XOR the n-bit input vector In'[n−1:0] with a secret key Key[n−1:0] followed by an SBOX that produces the n-bit output vector O[n−1:0]. The SubBytes block in the AES, equivalently, the Substitution BOX (SBOX) in DES algorithm, is the only nonlinear part of the algorithm. As such, it is more resilient to algorithmic cryptanalysis than other blocks.

A conventional multi-bit power analysis takes place as follows: an attacker injects a known stream of input vectors (plaintext) $In'_p = In'_p[n-1:0]$ for P clock cycles. The power trace is measured from the voltage supply, $V_{DD}$, for P·T seconds where T is the clock period. For each possible key value and input vector, a corresponding (hypothesized) output vector $O_{p,k}^h = O_{p,k}^h[n-1:0]$ is computed.

The hypothesized consumed current is computed from the output logical transition hypothesis matrix with regard to the underlying hardware. For example, in CMOS, a current is consumed at the output nodes only if the nodes switch from logical '0' to '1'. Hence the corresponding hypothesis for CMOS logic is $I_{p,k}^h = \alpha \cdot (HW(O_{p,k}^h) \cdot HD(O_{p,k}^h, O_{p+1,k}^h))$ where $\alpha$ is a scaling factor that relates to the underlying technology used to construct the transistors and gates of the architecture, and HW(•), and HD(•,•) stand for the Hamming weight and the Hamming distance of two binary vectors.

It is important to note that $In'_p$ and $O_p^h$ are binary vectors. The values of these vectors exist on the wires at the sampling time; i.e., $In'_p$ is the vector that appears on the inputs in each new clock cycle, and $O_p^h$ is the vector to be sampled at the outputs at the end of each clock cycle. The computed transition will occur at some point in time within the clock period.

For a single-bit attack, let $I_{p,k,i}^h$ be the $p^{th}$ current value that corresponds to a hypothesized logical-transition HW*HD of the $i^{th}$ bit, at the time this bit is produced. The value of $I_{p,k,i}^h$ under the assumption that a key k was used is:

$$I_{p,k,i}^h = \alpha \cdot (HW(O_{p,k}^h[i]) \cdot HD(O_{p,k}^h[i], O_{p+1,k}^h[i])), \quad (1)$$

Figure 2:
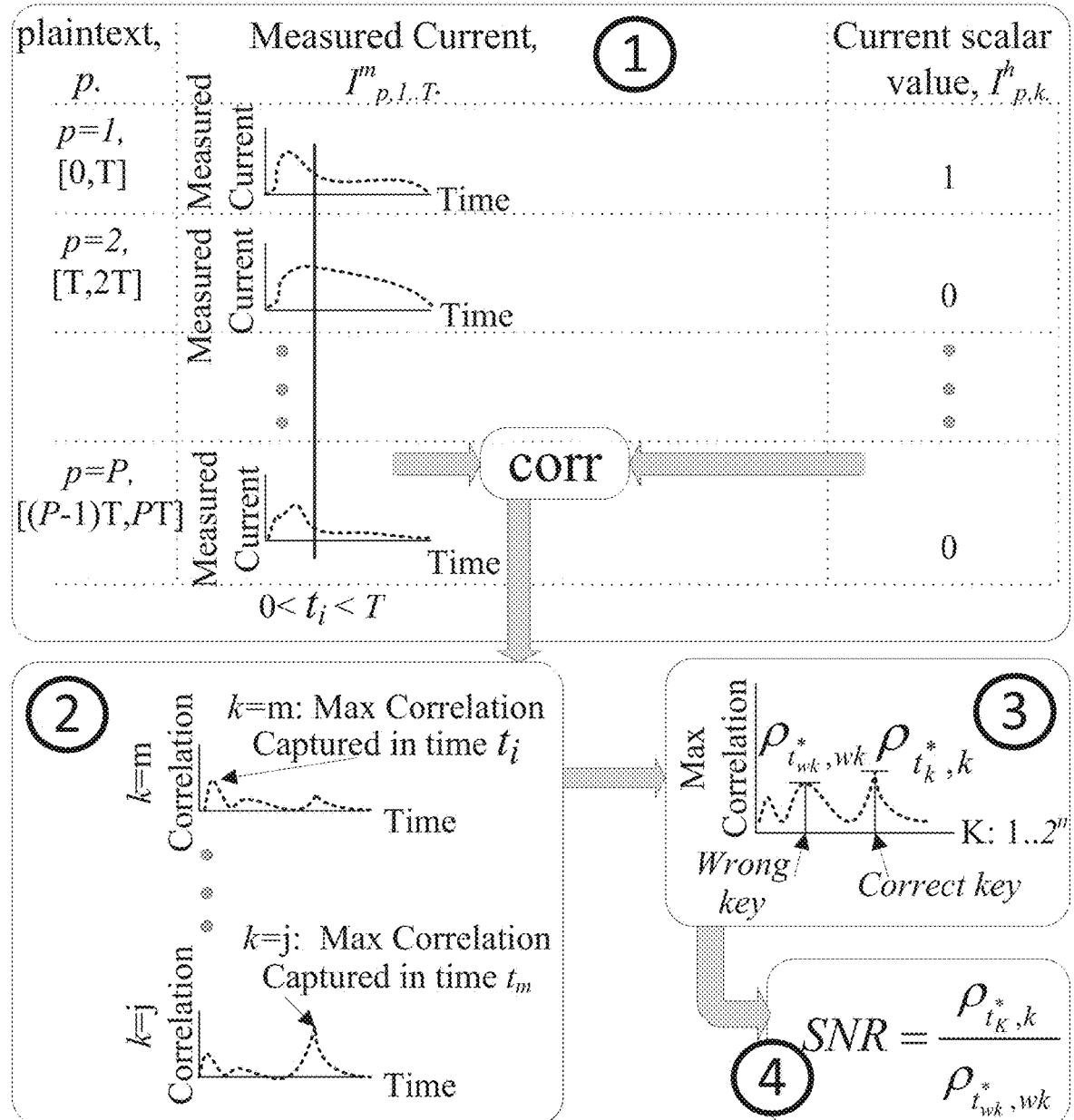
FIG. 2 illustrates a power attack procedure.

Existing attack procedures check whether the current drawn from the power supply during the clock period is correlative to the current scalar value calculated in Eqn. (1). These attack procedures disregard both the time of consumption during the clock period, and the shape of the current signal (as seen in FIG. 2). Next, the correlation between the measured Eqn. (1) for all keys is calculated. The correlation between two vectors is calculated as follows:

$$\rho_{t,k} = \text{corr}(I_{1...P,t}^m, I_{k,1...P}^h) = \frac{\text{cov}(I_{1...P,t}^m, I_{k,1...P}^h)}{\sigma_{I_t^m} \sigma_{I_k^h}} = \frac{E\left[(I_{1...P,t}^m - \mu_{I_t^m})(I_{k,1...P}^h - \mu_{I_k^h})\right]}{\sigma_{I_t^m} \sigma_{I_k^h}}, \quad (2)$$

$$t \in \{1 \ldots T\}, k \in \{1 \ldots 2^k\},$$

where E is the expected value operator, $\sigma$ and $\mu$ are the dataset variance and average respectively.

The computed correlation values form a $T \times 2^K$ matrix $\rho = \{\rho_{t,k}\}_{t=1,k=1}^{T,2^K}$. The columns of $\rho$ are referred to as correlation plots (vs. time). Each plot is searched for the maximum correlation point. That is, $t^*_k = \arg\max_{t \in \{1, \ldots, T\}} \rho_{t,k}$. The chosen key is the one that maximizes $\rho_{t^*_k,k}$. In a successful attack, the highest correlation value corresponds to the correct key.

One measure of the immunity of a circuit to power attacks via its Signal to Noise Ratio (SNR). The SNR is defined herein as the ratio between the maximum value of the correlation coefficient of the correct key (signal) in all time samples, $\rho^*_{t_k,correct-key}$, and the maximum value of the correlation coefficient of the best wrong key (noise), $\rho^*_{t_k,wrong-key}$, in all time samples. That is:

$$SNR = \frac{\max_{t \in \{1 \ldots T\}} (\rho_{t,Key})}{\max_{t \in \{1 \ldots T\}, k \in \{1 \ldots 2^K-1\} \setminus Key} (\rho_{t,k})} = \frac{\rho^*_{t_k,correct-key}}{\rho^*_{t_k,wrong-key}} \quad (3)$$

An example of the above process is illustrated in FIG. 2, which shows:
1) Computing the hypothesized current;
2) Calculating correlations for all t and all keys;
3) Finding the maximal correlation point per key; and
4) Computing SNR.

Average SNR values (on all keys) above one indicate vulnerability. An SNR that corresponds to a successful attack is illustrated in FIG. 2. Relating to first-order attack, the SNR as well as the decision regarding the secret key consider only two samples of the measured current (signal and noise). The approach of embodiments herein to mitigating PA attacks relies on the fact that in terms of computation complexity, there is no other viable way to extract the information that leaks from the circuit than to compare correlations in a small number of points in time.

It is noted that simulation results presented below are for noiseless simulations. Therefore, some of the reported SNR values are larger than 1. This does not mean that every attack will succeed. In real life, noise, lack of synchronization and sources of randomness may decrease the SNR of some keys well below 1. In particular, the SNR values discussed herein refer solely to the (hypothetical) worst case scenario. Clearly, a method that has an average SNR close to one in this scenario will provide high immunity in real life.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

II. Intra-Cycle Information Leakage as a Source of Randomness

Embodiments of the invention use intra-cycle currents as a source of randomness (in the eyes of the attacker) in order to help resist power attacks. The intra-cycle current is data-dependent. In order to reveal this data-dependency an attacker must have complete knowledge of the design (e.g.

gate level netlist, information regarding delays and complete wiring parasitic capacitance and resistances information of the design). However, without carrying out full reverse engineering this task is impossible. Furthermore, even after full reverse engineering, it is difficult to capture this dependency due to global and especially local variations. Moreover, an attacker that knows the functionality of the ADD-KEY_SBOX but cannot choose the key (i.e. cannot determine all the inputs to the circuit) cannot deduce anything about the design from the power traces. For this reason, an attacker cannot gain any information about the data dependent delays nor perform a statistical analysis.

Figure 3:
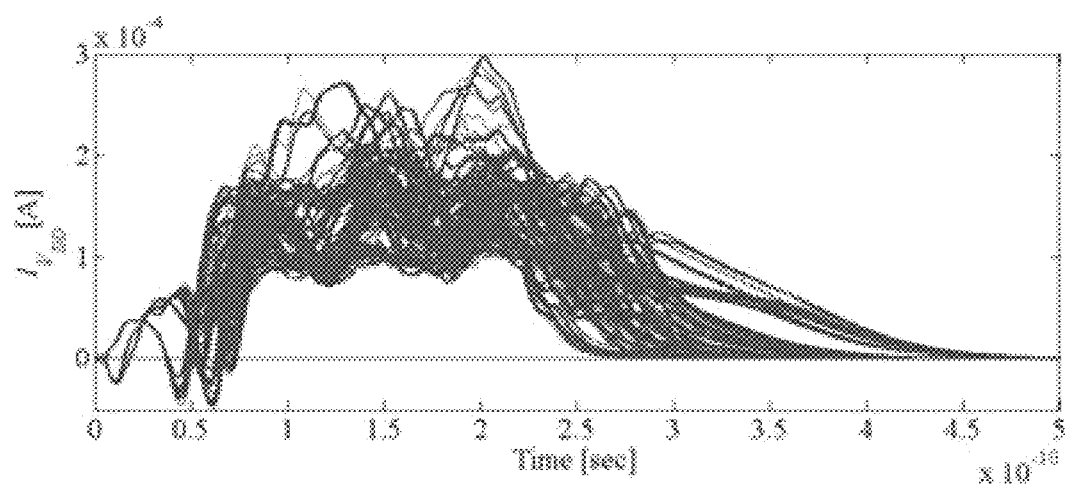
FIG. 3 shows power-supply current traces for 1000 different plaintexts.

Power supply current traces are usually noisy; but assume that an attacker has all 256 possible noiseless power supply current traces dissipated by a single 4-bit ADDKEY_SBOX with a fixed (but unknown) key. FIG. 3 shows an example of such noiseless power-supply current traces, $I_{VDD}$, for 1000 different plaintexts. Note that the consumed current that carries in information is of order [nA]s while the (noiseless) current from the whole ADDKEY_SBOX is of the magnitude 100 [uA].

The first step in a PA requires alignment of all the power traces according to the time that the output is finally produced (since $I_{p,k,i}^{h}$ from eq. (1) corresponds to the output's logical transition). Clearly, without knowing the internal delays of the system such alignment cannot be done since it requires timing information that is not available to the attacker. Without aligning each trace, the instantaneous dissipated current and $I_{p,k,i}^{h}$ are uncorrelated and no statistical analysis is possible.

Consequently, it is reasonable to assume that intra-Cycle information is unavailable to the attacker and that the attacker would not be able to utilize this information to instigate stronger attack. This indicates that a deliberate intra-cycle data-dependent current may be utilized as a source of randomness in the eyes of the attacker.

II(a) Delay Variance in Practice

Ideally, if no noise (thermal noise, noise due to voltage fluctuations, electromagnetic noise etc.) is present and all logic paths arrive at the same time to the output, there will be no arrival time variance. In practice, however, the arrival time (i.e. the delay) in the presence of noise is a random variable. Therefore, the correlation between the measured current and $I_{p,k,i}^{h}$ varies within the clock period.

II(b) Delay Variance of Different Designs

Figure 4:
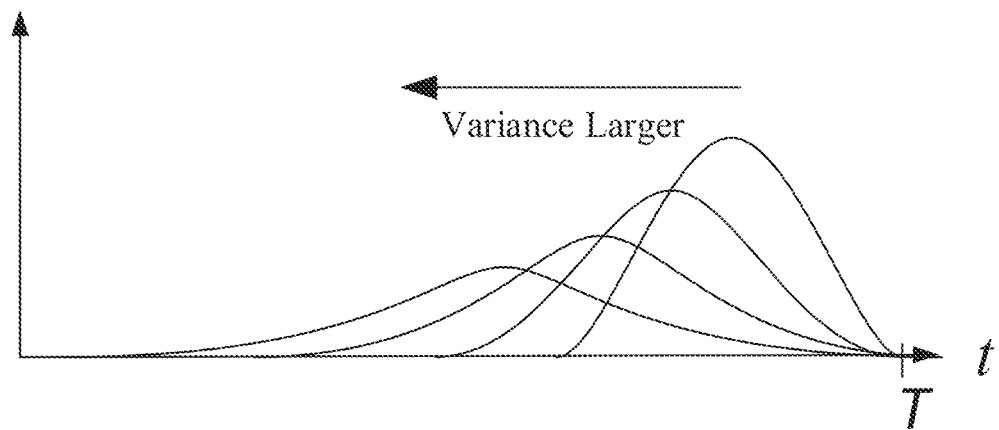
FIG. 4 is a Schematic illustration of Output rising signal data-dependent delay variances for different logical cone design.

FIG. 4 is a schematic illustration of output rising signal data-dependent delay variances for different logical cone designs. FIG. 4 illustrates the relationship between the structures of the logical cone and its data-dependent output delay. The smaller the delay variance so does the Output rising signal $V_{DD}/2$ crossing distribution variance (and the probability peak) is smaller. FIG. 4 is schematic; for simplicity, the delay is plotted as a continuous random variable, but in practice, it gets discrete values. In fact, due to delay constraints on all paths, all the rising signal delay must occur before T and hence t' decreases as the asymmetry increases.

A SingleBit attack is based on estimating the current drawn from a single output bit. The maximal correlation time, $t^{*}_{k}$, is not just key-dependent, but also depends on the delay paths in the logic cone associated with the bit under attack. Large data-dependent delay variance should decrease the probability of a successful SingleBit attack due to smaller probability peak (as shown in FIG. 4).

In a MultiBit attack, the attacker makes hypotheses on the current consumed (simultaneously) by several output nodes. Therefore, increased misalignment between different outputs nodes may increase the immunity of the circuit to such attacks.

It is clear from Eqn. 2 that conventional power attacks achieve low SNR values when the propagation time is data-dependent. Theoretically, a successful power attack is possible in cases where these data dependencies may be modeled and the attack procedure may be adjusted accordingly; nevertheless, the study of data-dependency requires full reverse engineering and the computational complexity involved in considering all these aspects makes such attacks impossible in real life.

III) Invention

Embodiments presented herein enhance the randomness of the data-dependent propagation delay in logic circuits in order to increase immunity to power attacks. Delay elements are introduced into logic paths within the logic circuit in a manner that creates data-dependent intra-cycle delays along one or more of the logic paths.

In the following, the term "delay element" means an element (whether physical or design-related) which adds the minimum delay time to a logic path. Embodiments herein specify a delay as an integer number of delay elements, however this does not limit the introduced delay to any particular size nor necessarily add discontinuity to propagation times along the logic paths beyond that which is physically achievable for the logic circuit.

Figure 5A:
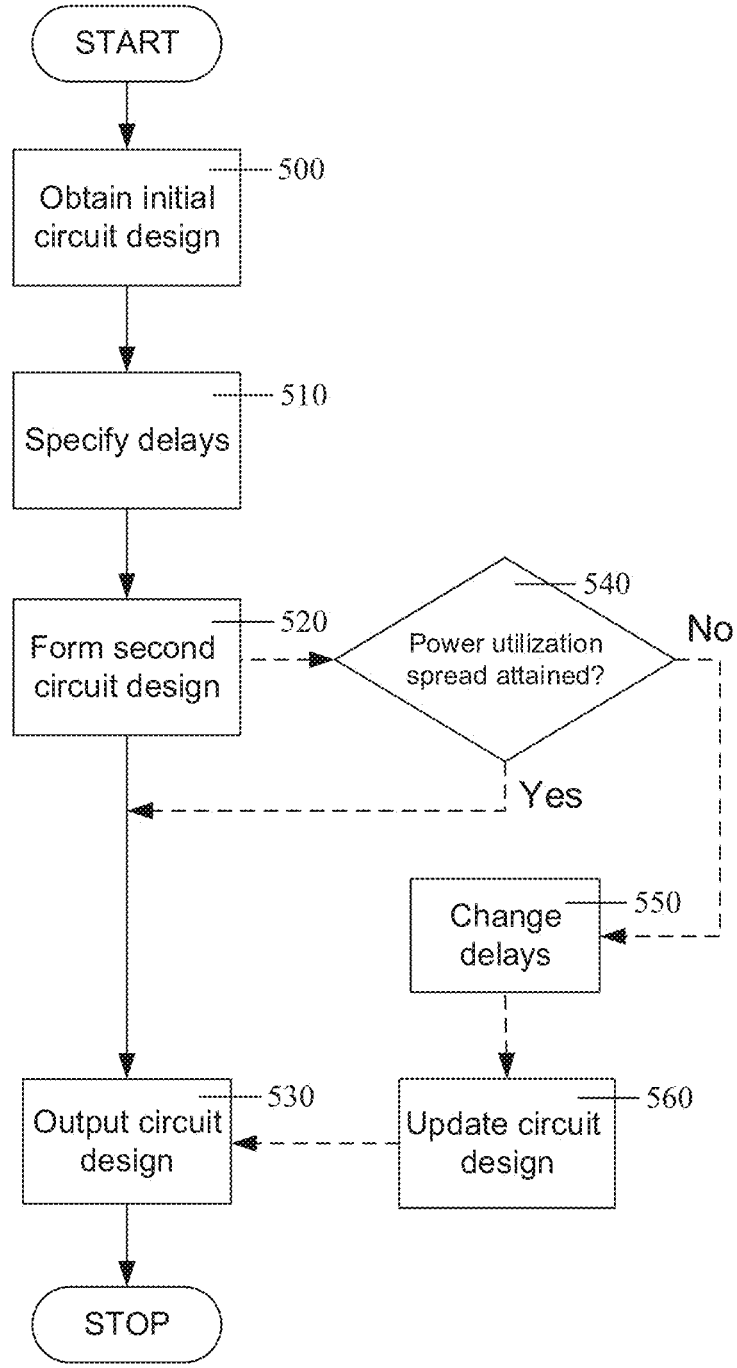
FIG. 5A is a simplified flowchart of a method of designing a logic circuit with data-dependent delays, according to embodiments of the invention.
Figure 9A:
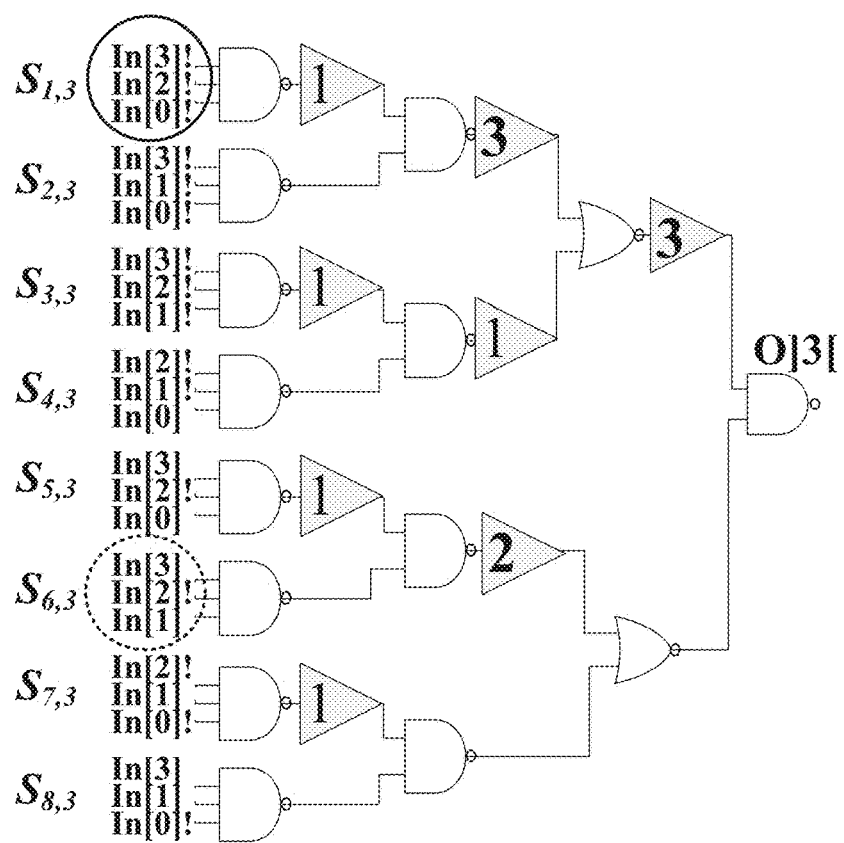
FIGS. 9A, 9B are partial gate level descriptions of an SBOX area-efficient shuffled design of O[3] and O[0] respectively, according to an exemplary embodiment of the invention.
Figure 9B:
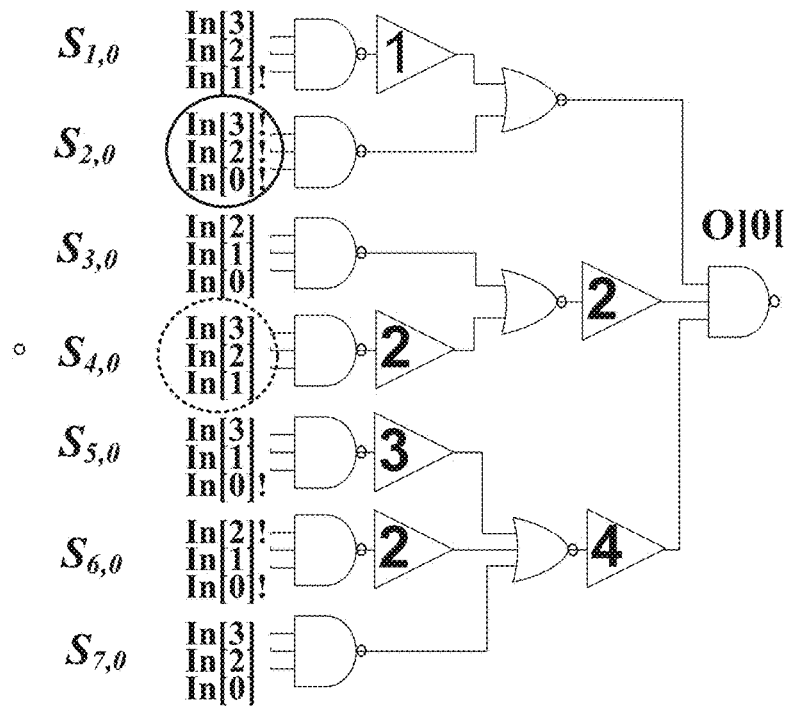

Reference is now made to FIG. 5A, which is a simplified block diagram of a method of designing a logic circuit with data-dependent delays, according to embodiments of the invention. The logic circuit includes logic paths from logic inputs to at least one logic output (for example as illustrated in FIGS. 9A-9B).

The logic circuit may include joint and/or disjoint logic cones. Some embodiments of the invention may be adapted as necessary to take into account the constraints that arise when logic cones share logic gates (i.e. joint logic cones).

The method is performed using an electronic design automation system. Optionally, the electronic design system includes at least one processor and non-volatile computer-readable memory storing instructions which cause the processor to perform the method and, optionally, to store additional data required for performing the method.

Optionally, the electronic design automation system is an independent system which inputs an initial circuit design that is provided by a separate circuit synthesis system. Alternately, the electronic design automation system is integrated into another circuit design tool. It is noted that the method is not limited to any specific circuit design tool or definition language.

In 500, an initial circuit design is obtained. The initial circuit design may be specified or defined by any means known in the art, for example as a netlist.

In 510, respective delays are specified for logic paths in the initial circuit design. The delays are selected so that one or more of the logic outputs will switch at different times within a clock cycle for different combinations of logic input levels (i.e. the delay is data-dependent).

Optionally, the delays cause a single output to switch at different times within a clock cycle for different input data (denoted single output intra-circuit delay). Alternately, the delays may cause different logic outputs to switch at different times in a data-dependent manner (denoted multiple output intra-circuit delay).

Further optionally, the delays cause a two-dimensional intra-circuit delay, meaning that the circuit has both single output intra-circuit delay and multiple output intra-circuit delay.

Optionally, the respective delays are specified by analyzing and/or simulating the circuit design and calculating delays which will yield a desired power utilization. Alternately or additionally, the delays are specified by selecting the number of delay elements per path in a random or semi-random manner, for example the RD design and the method presented in FIG. 5B.

Optionally, the method further includes identifying sets of inputs with correlated switching times for multiple outputs. This means that changes to a set of inputs would cause two or more outputs to switch at the same computation. Different respective delays are assigned to at least some of the logic paths with correlated switching.

In 520, a second circuit design which includes the specified respective delays along the respective logic paths is formed by adding delay elements to the initial circuit design. Optionally, locations are selected in the initial circuit logic paths and delays are embedded into the selected locations.

Optionally, the second circuit design is adjusted to reduce resource costs resulting from embedding the delay elements. The resource costs may include one or more of: circuit area, circuit power consumption and the quantity of delay elements embedded in the logic paths.

Typically, after manufacturing the delays are random variables. Different delays may be implemented with automated tools or by specific delay insertion, cell sizing and driving strength tuning, and many high level optimizations may be made to achieve this objective.

Optionally, at least one of the delay elements is:
a buffer;
a combination of buffers;
a logic gate;
a combination of logic gates;
a wire;
a resistive element;
a capacitive element; or
a connection between logic gates.

Optionally, adding a delay element is achieved by at least one of:
inserting a resistive element into the initial design;
inserting a capacitive element into the initial design;
adjusting cell sizing;
adjusting circuit layout; and
tuning driving strength.

Optionally, all the delay elements are of equal duration. In this case the total length of the delay may be specified by selecting the number of delay elements which should be inserted into a logic path. Alternately, different types of delay elements introduce different delay durations and the total length of the delay is specified by the number and type of delay elements.

Optionally the initial circuit design is analyzed (and/or simulated) to determine the initial delay along a particular logic path of the initial design. The initial delay is subtracted from the delay specified for the logic path in 510, and the difference is used to calculate the number of delay elements that should be into the logic path in order to obtain the required delay along that logic path.

Optionally, the initial circuit design is obtained by defining the logic circuit with a hardware description language (HDL) and then synthesizing the HDL definition into an initial netlist representing the initial circuit design.

Optionally, the second circuit design is created by adding the specified respective delays into the initial netlist to create a second netlist representing the second circuit design using any text editing tool or scripting tool known in the art (for example Pearl, Python, etc.).

Optionally, in 540 after the second circuit design in created it is analyzed to determine its power utilization spread and compared to the power utilization spread which is attainable with the initial circuit design. If the second circuit design's power utilization spread is not close enough to that attainable with the initial circuit design, in 550 at least one of the logic path delays is changed to form and the circuit design is updated in 560. Though not explicitly shown in FIGS. 5A-C, this analysis and updating may be performed and fine tuned until the required logic circuit performance is obtained.

Optionally, the second circuit design is adjusted to reduce the number of delay elements added to the logic paths (e.g. the P3 criterion presented below).

Optionally, the second circuit design is adjusted to reduce the difference between the number of delay elements assigned to the different logic paths within each logic cone, and also to reduce the difference between the number of delay elements assigned to logic paths in which switching activity occurs simultaneously at different outputs (e.g. the P4 criterion presented below).

Optionally, the delays are specified by assigning a common delay (i.e. the same delay) to all logic paths leading to a given output. The respective common delays differ amongst the outputs. An exemplary embodiment is the shifted design discussed below.

Optionally, the delays are specified by assigning different respective delays to multiple logic paths leading to a single output. An exemplary embodiment is the shuffled design discussed below.

Optionally, the number of delay elements added to each logic path is randomly selected from a specified range. An exemplary embodiment is the random delay (RD) design discussed below. Exemplary embodiments of the RD design may use both the PathGrouping and NodeDelayAssignment algorithms (described below) and still be considered random.

Figure 5B:
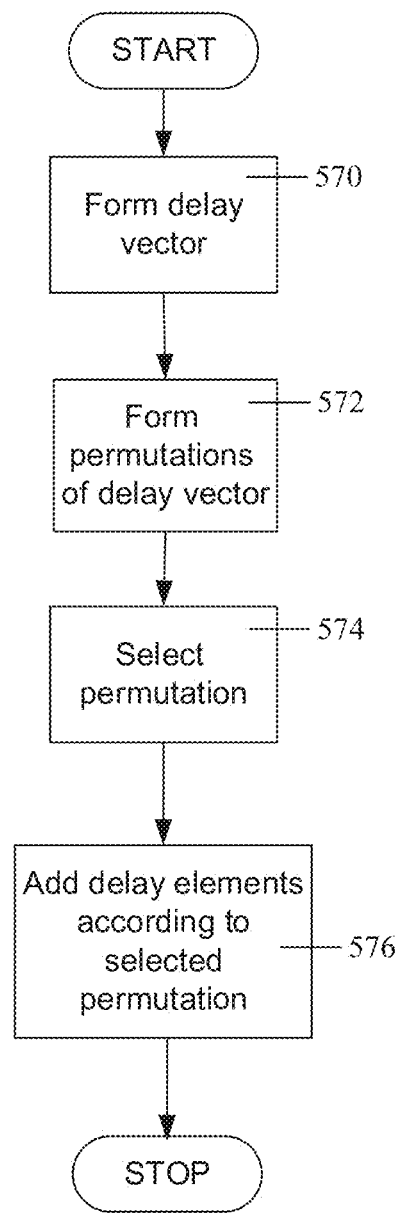
FIGS. 5B and 5C are simplified flowcharts of methods of specifying delays for logic paths in a logic circuit, according to respective embodiments of the invention.

A second exemplary embodiment of randomized delay specification is presented in FIG. 5B.

Reference is now made to FIG. 5B, which is a simplified flowchart of a method of specifying delays for logic paths in a logic circuit, according to embodiments of the invention.

In 570, a delay vector is formed. The length of the delay vector is at equal to the number of the logic paths in the logic cone. Each element of the delay vector specifies a number of delay elements. In 572 a set of permutations of the delay vector is formed. In 574, one of the permutations is randomly selected. In 576, the number of delay elements given by a respective element of the selected permutation is added to the respective logic path in the logic cone.

FIG. 5B relates to delay specification for a single logic cone. Optionally, when the logic circuit has multiple logic cones, a respective permutation is randomly selected for each logic cone.

Exemplary embodiments of the method of FIG. 5B may use both the PathGrouping and NodeDelayAssignment algorithms (described below) and still be considered random.

Optionally, delay specification takes into consideration logic path grouping, in which a group of logic paths is likely to have simultaneous or correlated switching activity. The logic paths in the initial circuit design are partitioned into groups in which switching occurs simultaneously at different outputs. For at least one of the groups, different respective delays are assigned to the group's logic paths.

Figure 5C:
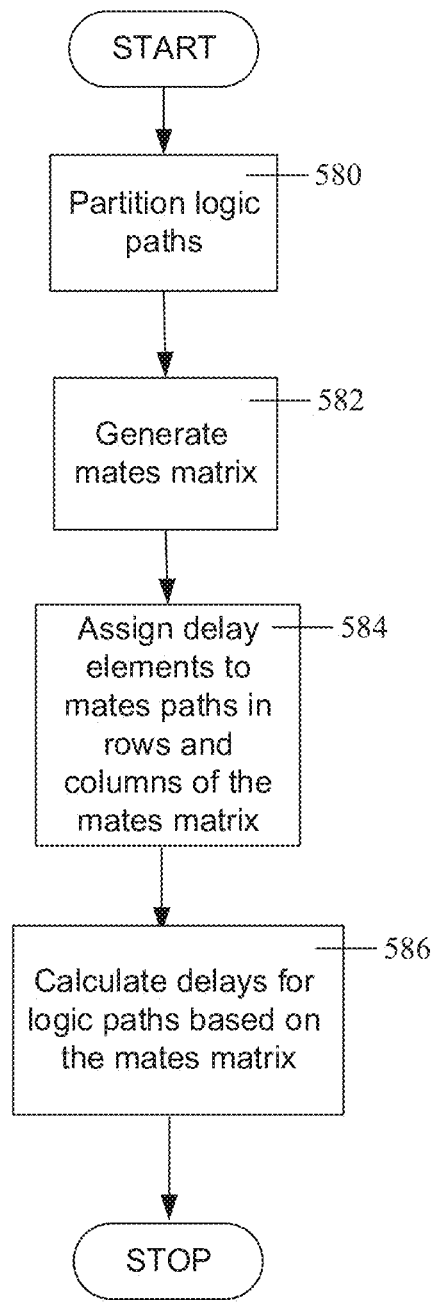

Reference is now made to FIG. 5C, which is a simplified flowchart of a method of specifying delays for logic paths in a logic circuit, according to embodiments of the invention. The method of FIG. 5C uses path grouping to obtain a mates matrix (similar to matrix M below).

In 580, the logic paths are partitioned into groups. At least one of the groups includes multiple logic paths in which switching activity will occur simultaneously at different outputs.

In 582, the mates matrix is generated. Each row of the matrix corresponding to a respective groups of logic paths and each column of the matrix corresponds to a respective output. Each cell of the matrix specifies a path from the respective group to the respective output. For example, the mates matrix shown in FIG. 12B mates path 2 of O[0] with path 1 of O[3] (these paths are shown by bold lines in FIG. 12A).

In 584 delays are assigned to the paths present in the mates matrix, in accordance with the paths specified in the rows and columns of the mates matrix. For each row in the mates matrix, a different number of delay elements is assigned to each path in the given row. Additionally, for each column in the mates matrix, a different number of delay elements is assigned to each path in the given column.

In 586, a respective number of delay elements which should be added to each of the logic paths is calculated, so that the number of delay elements embedded in each path conforms to the requirements of the mates matrix.

Optionally, the delays are calculated according to one or both of the following criteria:
 i) The number of delay elements added to the logic paths is minimized (e.g. P3 criterion); and
 ii) The number of delay elements assigned to the different logic paths within each logic cone and the difference between the number of delay elements assigned to logic paths in which switching activity occurs simultaneously at different outputs is reduced (e.g. the P4 criterion).

Embodiments of logic circuit with data-dependent delays may be implemented in circuits, including, but not limited to:
 a) An integrated circuit (IC) customized for a particular use, such as an Application-Specific Integrated Circuit (ASIC);
 b) A programmable logic device intended for general-purpose use. Examples of such programmable logic devices include, but are not limited to: Field-Programmable Gate Array (FPGA), Gate Array, Uncommitted Logic Array (ULA), Programmable Logic Array (PLA), Programmable Array Logic (PAL), Complex Programmable Logic Device (CPLD), Erasable Programmable Logic Device (EPLD) and Structured ASIC.

Specifying Logic Path Delays

Several exemplary methods for specifying the respective delays for logic paths are presented herein. These methods include, but are not limited to, the following designs:
 i) Shifted design—a common delay is assigned to all logic paths to a single output. Different common delays are assigned to different logic outputs.
 ii) Shuffled design—different respective delays are assigned to different logic paths to a single output.
 iii) Random delay (RD) design—the number of delay elements added to at least some of the logic paths is randomly selected from a specified range. Typically, in RD the assigned delays will be uniformly distributed over the clock cycle.
 iv) Permutated design (PD)—a set of permutations of a vector specifying different delay lengths (e.g. number of delay elements) is formed. For a given logic cone, the delays are specified by randomly (or semi-randomly) selecting one of the permutations.
 v) Matrix-based delay assignment design (MD)—a delay matrix A is built in which the numbers in any column are distinct and the number in any row are distinct (e.g. a Latin square matrix). Matrix operations are performed to ensure that the maximal value in delay matrix A is minimal, and that the difference between the maximum and minimum number is as small as possible between all rows and all columns. (These correspond to the P1-P4 properties described below). The delay matrix is translated into a D matrix which specifies the respective number of delay elements for each logic path (i.e. from all logic inputs to all logic outputs). MD design reduces correlated switching between different outputs in response to similar sets of inputs. (In the exemplary embodiment presented below the MD design is obtained by running the whole procedure i.e. PathGrouping, PathDelayAssignment and NodeDelayAssignment).

Exemplary embodiments of these design strategies are presented below.

The shifted and shuffled designs as described below are demonstrated on disjoint logic cones (no shared logic gates between outputs) however they are also suitable for non-disjoint logic circuits. The RD, MD and PD designs demonstrated below for logic circuits with non-disjoint logic cones (in which at least two outputs have a common logic gate) however they are suitable for disjoint circuits as well.

Optionally, prior to specifying the delays, disjoint equivalents are formed for joint logic cones and the method is applied to the circuit with disjoint equivalents.

Optionally, delays are specified for each logic cone independently of the other logic cones.

IV. The Concept and Design Guidelines of Data Dependent Delays

In a circuit with disjoint logic cones each logic input affects a single logic output. No logic gates are shared by multiple outputs.

IV(a) Balanced Design (Symmetric) and Shifted Design

The balanced design (also denoted herein a symmetric design) does not incorporate the data-dependent delay circuit design presented herein, but is used as a reference for evaluating the performance of simulated exemplary embodiments of the invention. In the balanced design, all outputs are designed to achieve a small data-dependent delay-variance, $\sigma_D$, and all have the same average output delay. A balanced design is assumed to be sensitive to MultiBit as well as SingleBit attacks. A complete balanced design is not achievable in practice. However, to capture this tendency, a sub-optimal design is sufficient.

Figure 6:
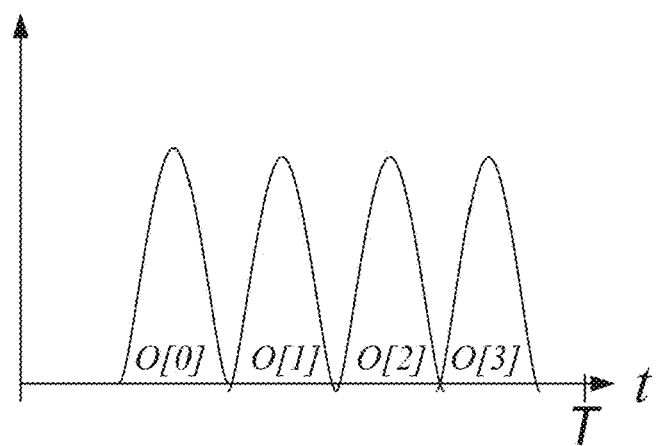
FIG. 6 is a schematic illustration of Output rising signal delay distribution of logical cones with Shifted average delay, according to an exemplary embodiment of the invention.

Some embodiments insert delays into the logic circuit using a Shifted design. All outputs have data-dependent delay-variance (typically relatively small) and each output has a different average delay. This approach is illustrated in FIG. 6, which is a schematic illustration of output rising signal delay distribution of logical cones with a shifted average delay.

This design may be more sensitive to a Single Bit attack since the other current consumers may be easily averaged out. This design decreases the correlation of a Multi Bit attack due to the lack of synchronization of the output arrival time (i.e. with very high probability that the rising voltage induces a current flow simultaneously for different outputs). Therefore, it is less sensitive to MultiBit attacks.

The shifted design may be considered a "one-dimensional" design. The basic shifted design ensures that the average delay is different for the different outputs (first dimension). However it does not introduce randomization into the delay distribution for each single output (second dimension).

IV(b) Shuffling as a Source of Randomness

In some embodiments delays are inserted into the logic circuit using a shuffled design. Each output has a large data-dependent delay variation and a different average delay.

IV(c) Exemplary SBOX Data-Dependent Designs

Reference is now made to FIGS. 7-9A, which are simplified gate level descriptions of Symmetric and Shuffled designs of the third output, O[3] of a 4-bit ADDKEY_SBOX block. Delay elements (buffers) are denoted by triangles and the number inside each buffer is proportional to its delay (in units of a single minimum sized buffer). Note that in a Symmetric design, all the buffers have zero delay (i.e. no additional delays are inserted into the logic paths).

Figure 7:
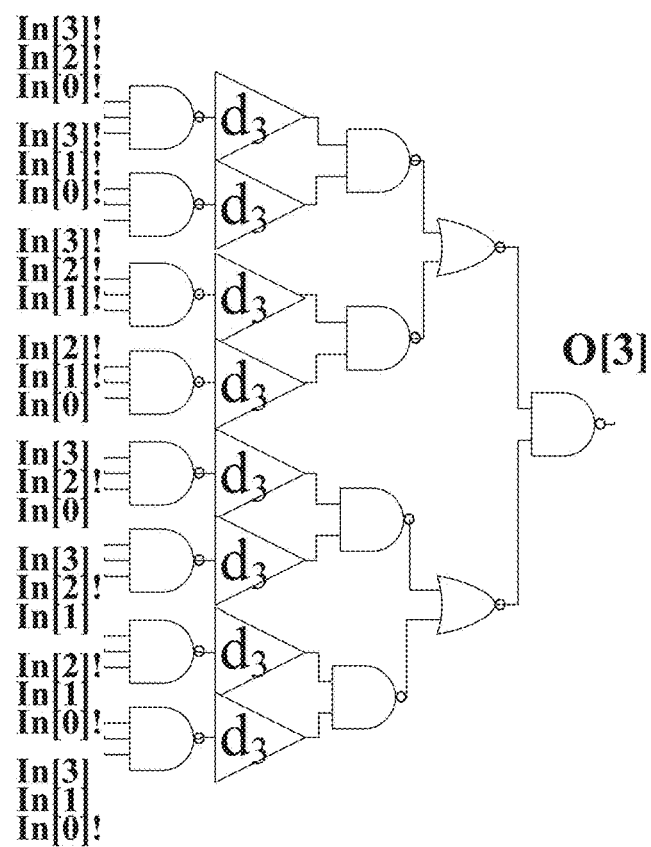
FIG. 7 is a partial gate level description of an SBOX shifted design of O[3], according to an exemplary embodiment of the invention.

FIG. 7 shows a shifted design. Each path that leads to O[i] is delayed by the same delay value, $d_i$. FIG. 7 shows the logical cone containing the eight paths leading from inputs In[0]-In[3] to output O[3]. It is seen that the same delay, $d_3$ is included in each logic path.

A simple expansion of the shifted design concept to account for the two dimensions (single and multiple outputs) is to assign $d_j + i \cdot d_{j\_max}$ delay to all paths j in the cone leading to output i, where j_max is the maximum number of paths in any of the logical cones. In the context of the shifted design all paths numbered j have shifted delay versions (with shifts of $i \cdot d_{j\_max}$) and inside a cone each path is a shifted version of its predecessor. Note that this design is highly inefficient in terms of number of added delay element, area utilization and power consumption.

Figure 8:
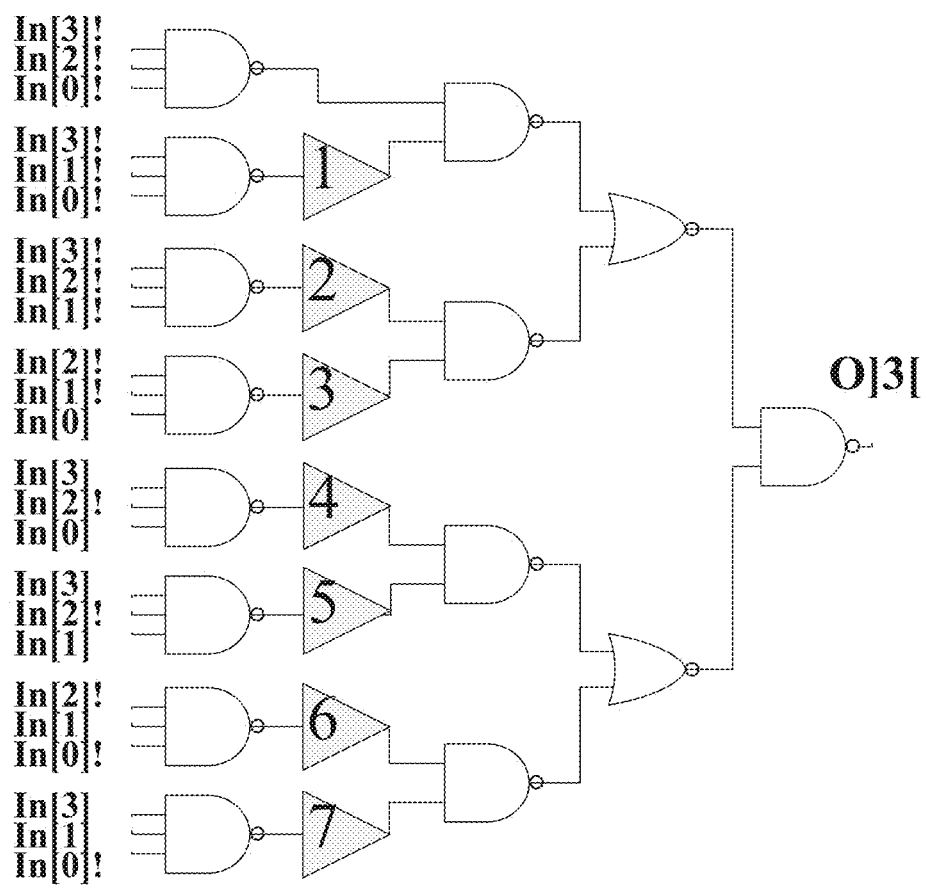
FIG. 8 is a partial gate level description of an SBOX area-inefficient shuffled design of O[3], according to an exemplary embodiment of the invention.

FIGS. 8-9B show examples of shuffled designs. FIGS. 8 and 9A show two shuffled designs for O[3]. These designs differ in their area and energy consumption. FIG. 8 is a simple but area-inefficient design, in which each logic path has separate delay element(s). FIGS. 9A-9B are area-efficient shuffled designs for outputs O[3] and O[0] respectively, in which delay elements are shared by logic paths thereby reducing the total number of delay elements required. The corresponding output voltage distributions of these designs are shown in FIGS. 20A-20L.

IV(d) Exemplary Delay Assignment Method and Path Grouping Algorithm

Table 1 shows an exemplary algorithm for delay assignment for a shuffled logic circuit design. The following notations are used:

The clock cycle time is denoted by T and $D_{buf}$ stands for the delay of a buffer. $N_j$ is the number of paths from the inputs to the $j^{th}$ output. Define $w = \arg \max_j N_j$. Then $T = D_{buf} N_w$. Let $P_j$ be a set of integers that represent paths from the inputs to the $j^{th}$ output and let $S_{i,j}$ be the set of inputs used in the $i^{th}$ path to the $j^{th}$ output. Denote by $D_{i,j}$ the delay on the $i^{th}$ path to the $j^{th}$ output. All delays are initialized to zero.

The symbol x, denotes a Cartesian product of two sets. For example, let $P_1 = \{1,2,3\}$, $P_2 = \{2,5\}$, then the product $P_1 \times P_2$ consists of 6 ordered pairs $\{(a,b) | a \in P_1, b \in P_2\}$.

To simplify the presentation, we define a null character '*' that is used when one of the sets is empty. For example, if $P_2 = \varphi$ then $P_1 \times P_2 = \{(a,*) | a \in P_1\}$.

Denote by $Z^n$ the set of integers $\{0, 1, \ldots, n-1\}$. Let $v = (v_0, v_1, \ldots, v_{n-1})$ be vector over $Z^n \cup \{*\}$, and define $|v| \square |\{i | v_i \neq *, 0 \leq i < n\}|$.

TABLE 1

Delay-assignment for Shuffled design:
    1. For $0 < j \leq n - 1$, $P_j := \{1, 2, \ldots, N_j\} \cup \{*\}$.
    2. $V := P_0 \times P_1 \times \ldots \times P_{n-1}$.
    3. For i=1 to $N_w$, $D_{i,w} := (N_w - i) \cdot D_{buf}$.
    4. While $V \neq \{(*,*,\ldots,*)\}$,
        Find a vector $v = (v_0, v_1, \ldots, v_{n-1}) \in V$
        which maximizes the size of the set
$$S := \bigcap_{j, P_j \neq \phi} S_{v_j, j}.$$
        If $|v| > 1$, AssignDelays(v).
        For $0 < j \leq n - 1$ and $v_j \neq *$, $P_j := P_j \setminus \{v_j\}$.
        $V := P_0 \times P_1 \times \ldots \times P_{n-1}$.
        Go to step 4.
    End
AssignDelays(v)
    1. Initialization: $\Delta := T/(|v| - 1)$, $z := 1$.
    2. If $v_w \neq *$, then $w' = w$,
        Else, $w' := \arg \max_{j, v_j \neq *} N_j$; $D_{v_w, w'} := \min\{Z^n \setminus \{D_{i, w'}\}_{i \notin P_w}\}$.
    3. For $0 < j \leq n - 1$,
        $j' := j + w' \mod n$,
        if $v_{j'} \neq *$,
        $D_{v_{j'}, j'} := \lfloor D_{v_w, w'} + z \cdot \Delta \rfloor \mod(T + 1)$; $z := z + 1$.
    End.

For example, consider the circuit shown in FIGS. 9A-9B, and assume that we want to shuffle only O[3] and O[0]. That is $P_0 = \{1, 2, \ldots, 7\} \cup \{*\}$, $P_3 = \{1, 2, \ldots, 8\} \cup \{*\}$, and for j=1, 2 we have $P_j = \{*\}$. Clearly, w=3. Let $T = 7D_{buf}$. The vector $v = (5,*,*,8)$ maximizes the size of S since $S_{8,3} = \{In[3], In[1], In[0]!\}$ $S_{5,0} = \{In[3], In[1], In[0]!\}$. The path corresponding to $S_{8,3}$ was initialized to $D_{8,3} = 0$. The number of delay elements added to the path of $S_{5,0}$ is $D_{5,0} = D_{8,3} + 1 \cdot 7D_{buf} = 7D_{buf}$. This type of construction will enforce different outputs to dissipate correlative currents in different times. This in turn, disables simultaneous MultiBit current dissipation, and therefore, increases the immunity of Shuffled designs.

V. Delay Assignment Methodology

As discussed above, an SBOX has n inputs and n outputs. All the outputs truly depend on all the inputs; it is reasonable to assume that paths connected to different outputs and triggered by the same subset of inputs will switch the outputs almost simultaneously. Therefore, to mitigate a MultiBit (logic) PA attack, these outputs' switching times should be distributed uniformly within the clock cycle.

A shift in the evaluation time of the outputs may increase the SNR of SingleBit attacks. Therefore, the goal is to generate a uniform delay distribution for each output (to mitigate SingleBit attacks), and also to assign delays such that different outputs arrive at different times for subsets of active inputs to mitigate MultiBit attacks. In what follows we refer to this requirement as the 2-Dimension (2D) requirement.

Figure 10:
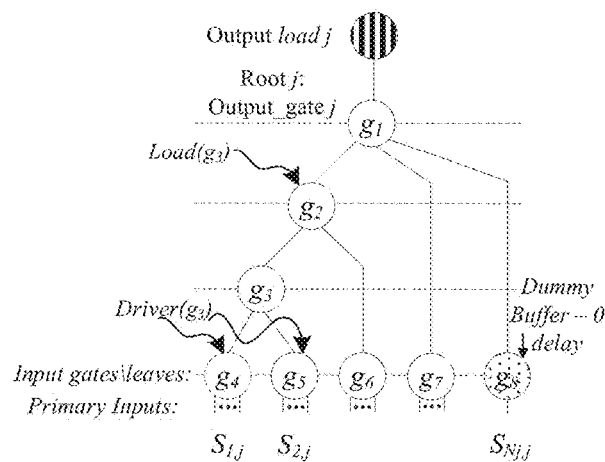
FIG. 10 is a simplified schematic logical cone leading to output[j]

FIG. 10 shows a schematic logic cone of a single output, O[j]. The logic cone consists of seven gates and one dummy buffer (which was added for the purpose of simplifying the explanation). These elements are represented as nodes. Five of the nodes are leaves (input gates). They define distinct paths from inputs to output. In addition, the load that the circuit drive is represented by a special node called the output load. Denote by $N_j$ the number of paths in the j-th cone, and define $N = \max_j N_j$. The subset of inputs entering the i-th leaf of the j-th output is denoted by $s_{i,j}$ and the delay on this i-th path is denoted as $D_{i,j}$. The delays form an N×n matrix (where some cells may be empty). The initial value of $D_{i,j}$ before embedding additional delays into the circuit may be obtained, for example, from the logic netlist. This value is denoted as $D_{i,j}^o$. Note that $D_{i,j}^o$ is an integer representing the delay in units of $T_{buf}$, the propagation delay of a single buffer.

In some embodiments, the minimal number is embedded into a given circuit such that the 2D requirement is fulfilled and that $\overline{D}=\max_{i,j}D_{i,j}$ is minimal. The value of the optimal $\overline{D}$ depends on the circuit structure.

Figure 11:
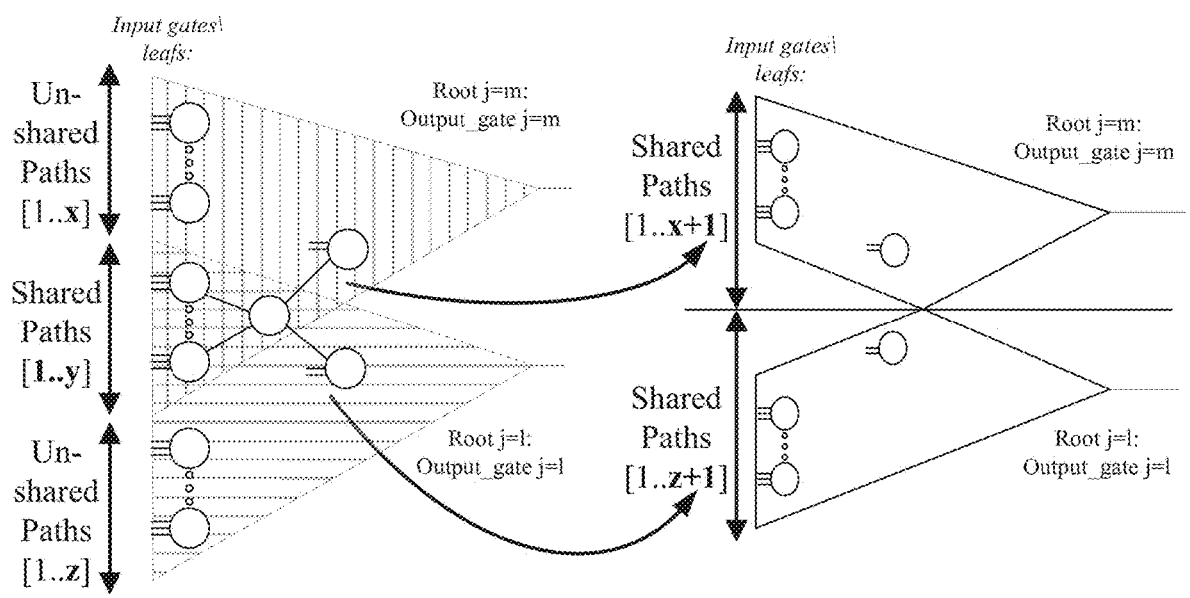
FIG. 11 is simplified logic circuitry with joint logic cones.

Designs with fan-out greater than one may produce logical cones with shared nodes. The left side of FIG. 11 shows two logic cones that have several nodes in common. However, a large fan-out (>2) degrades the security level of a circuit and exposes it to PA attacks on internal nodes. In the context of delay assignment, a logic cone that consists of a set of common nodes may be replaced by two single nodes in a disjoint equivalent implementation as shown in the right side of FIG. 11. The delays within the sub-cone formed by these common nodes are assigned to comply with the 2D requirement.

V(a) Exemplary Design Methodology for Joint Logic Cones

Following is a high level description of an exemplary embodiment of the invention which is suitable for logic circuits with or without joint logic cones.

A Latin Square is an m×m array filled with m distinct numbers such that every number appears exactly once in every row and in every column. In the present exemplary embodiment, the delay matrix is not a sub-set of a Latin square of size m with some empty cells (where $N_j<N$) but it is very similar to it. As shown below, a Latin Square-based assignment may be better than a random delay assignment, but may be inferior to an assignment which complies with the 2D requirement.

In what follows, instead of working directly on D, we construct a security oriented (and possibly larger) delay matrix A, of size q×n, and then translate it into D. The matrix A has the following properties:

P1. the numbers in any column are distinct (to mitigate SingleBit attacks),
P2. the numbers in any row are distinct (to mitigate MultiBit attacks),
P3. the maximal value is the smallest possible (to achieve minimal power, clock period and area overhead), and,
P4. the difference between the maximal and minimal values is as small as possible between all rows and columns (to disable design-oriented attacks).

Note that P1-P2 embodies the 2D requirement.

In general, the number of rows in A, q, is determined by analyzing the possible correlations in arrival times along propagation paths in different cones. This analysis also yields a Mates (M) matrix of size q×n. Each row in M corresponds to a set of paths (at most one path per output) that are most likely to switch simultaneously. These sets are disjoint. The mates matrix M is used to transform the initial delay matrix into A and vice versa, as described in more detail below.

The present exemplary embodiment uses a greedy yet simple algorithm that includes three steps:
1. PathGrouping—locates the most probable sets of paths through which switching activity will occur simultaneously at different outputs, and constructs matrix M.
2. PathDelayAssignment—assigns delays at the path level; it constructs matrix A.
3. NodeDelayAssignment—works at the node level. It folds matrix A into delay matrix D and distributes the path delays between internal nodes while minimizing the number of delay elements.

V(b) Path Delay Assignment

A) PathGrouping generates a mates matrix M where $M_{i,j}$ may hold an integer from 1 to N or the symbol which indicates that no path in the jth cone will be triggered (with high probability) together with the paths in this set.

Figure 12A:
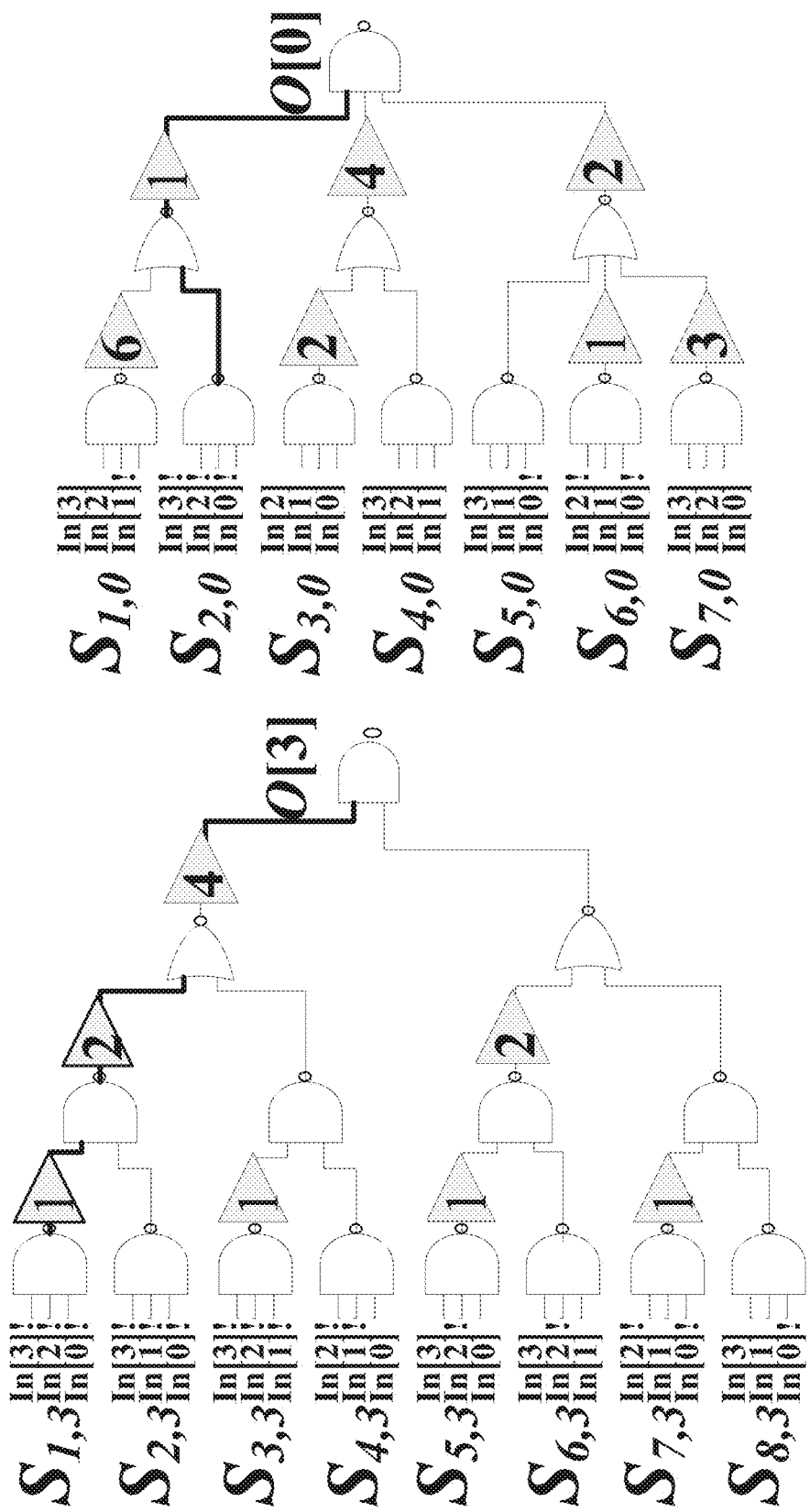
FIGS. 12A, 12B are partial gate level descriptions of an SBOX (O[3] and O[0]) and its corresponding Mates matrix, according to an exemplary embodiment of the invention.
Figures 12B, 13:
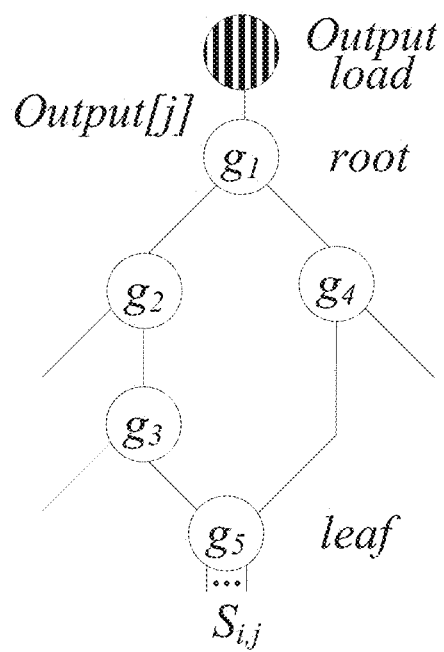
FIG. 13 is a simplified diagram of a schematic logical cone leading to output[j]

FIGS. 12A-12B are respectively a partial gate level description of the SBOX and its corresponding Mates matrix, M. The exclamation mark denotes the complement. The first row in M mates $S_{2,0}$ and $S_{1,3}$ which are likely to switch O[3] and O[0] simultaneously.

Note that in some circuits, in cases of split and reunite as shown for example in FIG. 13 (more than one path from leaf to root) delays must be assigned to balance the delay between these paths since all of these paths are in fact represented by a single row in M.

The PathDelayAssignment algorithm starts by mapping the initial delay matrix $D^0$ into A using M:

$$A_{i,j}=D_{M_{i,j},j}^0$$

M will be used later on to map the new A back into D.

The PathDelayAssignment algorithm is divided into two parts. The first part, entitled herein Up-Stream, increases the values of non-empty cells in A to comply with requirements P1-P3 while keeping the cell values as small as possible (minimum delay additions). A cell value is incremented only if there is another cell in its row or column that has the same value. Since each cell has at most m−1 'competitors', its value may not be increased more than m−1 times. Therefore, at the end of this part, we have, $$\underline{D}^0 \leq A_{i,j} \leq m+\overline{D}^0-1.$$

The second part, entitled herein Down-Stream, aims to fulfill requirement P4; namely, to decrease the difference between the largest and smallest values in A for all rows and columns. This is done by raising the cell values (while preserving P1-P3) until we get the minimal gap; i.e., $$m-1 \leq \max_{i,j}A_{i,j} - \min_{i,j}A_{i,j} \leq 2m-3.$$

It is always possible to achieve the lower bound by raising the initial values of A to $\overline{D}^0$. The upper bound is achieved when the initial A is of the form:

$$A = \begin{bmatrix} L_{m-1 \times m-1} & B_{m-1 \times 1} \\ C_{1 \times m-1} & a_{m,m} \end{bmatrix},$$

where $L_{m-1 \times m-1}$ is a full Latin square.

A formal description of the PathDelayAssignment algorithm is provided in the Exemplary Delay Assignment Algorithms section below. Here we illustrate how it works through two examples of joint and disjoint examples.

V(c) Disjoint Implementation Example

Figures 14, 15:
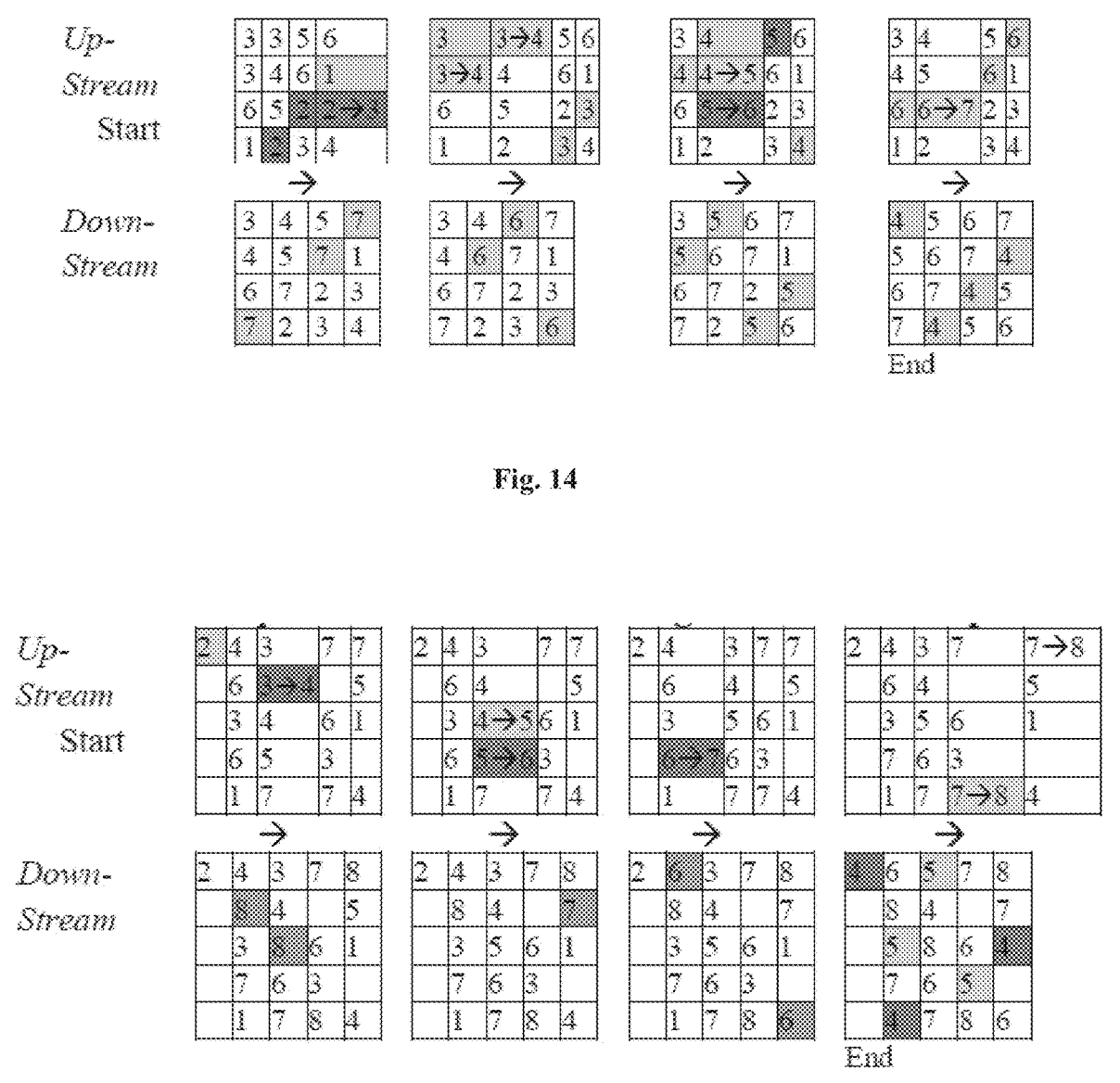

Consider a 4-bit Sbox whose initial Mates matrix is of the form $M_{i,j}=i$. In this case we have n=q=4, and the assignment matrix A equals the initial delay matrix $D^0$. FIG. 14 shows how the algorithm works step by step. The initial A matrix is shown at the top left corner of the figure. The Up-Stream algorithm scans all rows from top to bottom starting from the smallest value and increases the cell values until it complies with properties P1-P2. Namely, we start with the value 1 and see that there is no collision. However, the value 2, appears twice in the same row and therefore it is incremented by one, etc. At the end of this part, the minimal value in A is 1 and the maximal is $\overline{D}=7$. Note that this greedy assignment is not optimal; it is possible to assign delays such that $\overline{D}=6$ (For example the matrix: [3,4,5,6;3,4,6,5;6,5,4,3;5,6,3,4]).

The Down-Stream part starts with the largest value in A and raises the largest element in each row to this value. Clearly, this operation cannot harm P1-P3. Then, the algorithm repeats this operation for the next-largest value, etc., until it reaches $\underline{D}=\overline{D}-m+1$.

Note that in this example, we started with $\underline{D}^0=1$, $\overline{D}^0=6$, and ended with a matrix that fulfils the 2D requirement with $\underline{D}=4$, $\overline{D}=7$.

FIG. 15 shows how the algorithm runs on a mates matrix with unused cells.

Recall that in a joint implementation, sets of common leaves are replaced by a single node to create an equivalent disjoint implementation (FIG. 11). After the delays are assigned by the Up-Stream and Down-Stream algorithm, these artificial nodes are replaced by the original ones. Specifically, denote by $L_w$ the number of leaves in the w-th shared sub-cone, and define $L=\max_w L_w$. Then, $L_w-1$ rows must be added to a row that contains a node that represents $L_w$ leaves; each row must only carry values in the cells that correspond to these leaves while maintaining properties P1-P3. Algorithm 2B, presented below, is an exemplary algorithm for expanding artificial nodes. An illustrative example is presented below.

V(d) NodeDelayAssignment Algorithm

There are several ways to embed the delay elements in the logic. In order to save area (and consequently energy) the delay elements should be shared between converging paths. The NodeDelayAssignment algorithm is described in the Exemplary Delay Assignment Algorithms section below.

The NodeDelayAssignment algorithm searches for the maximal delay-sharing possible for each logical sub tree, and assigns this delay by a buffer to the corresponding wires of these shared nodes. The procedure is recursive and processed stage-by-stage from the tree-root to the leaf pins.

The algorithm employs the function Load(g,j) which receives a gate, g, and returns a list of all gates connected to the outputs of g (loads) on the path to output j (if g is not on the path it returns null). Similarly, the function Driver(g,j) receives a gate, g, and returns all the gates that are connected to its inputs (drivers) associated with the $j^{th}$ cone; clearly if g is not part of the logic cone of the $j^{th}$ output the function returns null. If some primary input in a design is connected to a gate which is not an input gate we impose a dummy buffer gate with 0 delay on the wire. See FIG. 10.

It is important to note that the assignment is made with respect to the initial delay of the circuit $D^0$; therefore, the algorithms assign the difference, $D-D^0$. The algorithm starts from a root-node and recursively goes down the tree to all nodes and assigns delays to the buffers. The delay assigned to a buffer reflects the maximum delay that may be shared between all paths which leads to the current node.

Figure 16A:
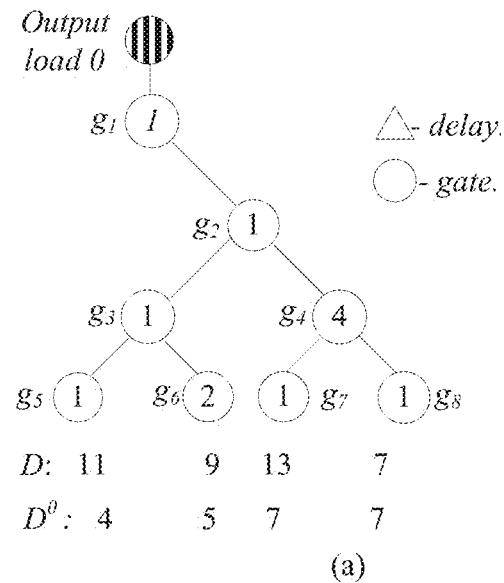
FIGS. 16A, 16B are a pre Node-Delay-Assignment sub-tree and a post Node-Delay-Assignment sub-tree respectively, according to an exemplary embodiment of the invention.
Figure 16B:
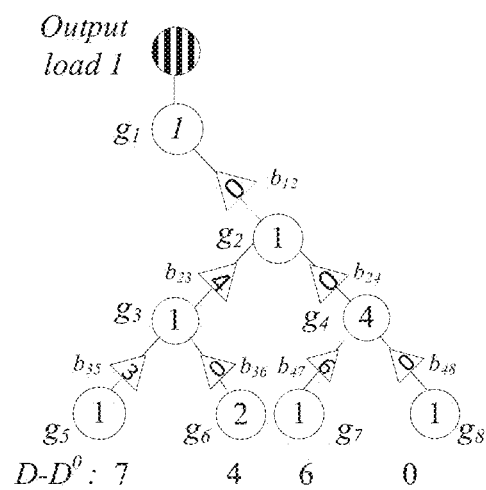

The following example illustrates the algorithm. FIGS. 16A and 16B are simplified examples of a pre Node-Delay-Assignment sub-tree and a post Node-Delay-Assignment sub-tree respectively.

Consider the circuit represented by the graph in FIG. 16A. Gates on the graph are denoted by circles, and the inherent delay of each gate is written inside the circle. The initial delay, $D^0$, and the assigned delay, D, of each path is written below the leaf of the path. FIG. 16B shows the results of the NodeDelayAssignment algorithm. The triangles represent buffers; each delay appears in the triangle. The delay difference $D-D^0$ is indicated below the paths. In our case buffer $b_{12}$ (located between g1 to g2) is assigned with:

$b_{12}=\min(7,4,6,0)=0$, $b_{23}=\min(7,4)-b_{12}=4$ and, $b_{35}=7-(b_{12}+b_{23})$, Note that when the algorithm reaches a leaf node it is directly assigned the remaining delay. A detailed example of NodeDelayAssignment in joint implementation is presented below.

V(e) Exemplary Delay Assignment Algorithms and ExpandArtificialNodes Algorithm for Joint Structures ---
Algorithm 2: PathDelayAssignment
---

Up-Stream:
$a_{max}$ = max A;
w = min A;
while w ≤ $a_{max}$ do:    %Start from the largest value
    For i = 1 : q,    %Work row by row.
        J := {j : $A_{i,j}$ = w};    %Find cells with delay w.
        If J ≠ Φ,    %If there is more than one such cell, lift delays up:
            s := min J;
            I := {t :$A_{t,s}$ = w};
            $A_{i,j}$ := w + 1 for all j ∈ J \{s};    %Increment the delay of other cells
            $A_{t,s}$ := w + 1 for all t ∈ I \{i};    %in the same row and column.
            If w = $a_{max}$, $a_{max}$ ++;    %Update the value of the maximal delay.
        end
    end
    w + +;
end
Down-Stream:
$a_{min}$ = max A − m + 1;
w = max A;
while w ≥ $a_{min}$ do:    %Start from the largest value
    For i = 1 : q,    %Work row by row
        J := {j : $A_{i,j}$ = w};    %Find cells with delay w
        If J = Φ,    %If there are no such cells
            J' := {j :$A_{i,j}$ < w, $A_{:,j}$ ≠ w},    %Find candidates for lifting-up
            If J' ≠ Φ,
                s := arg max $_{j∈J'}$ $A_{i,j}$;    %Select the maximal value cell
                $A_{i,s}$ := w;
            end
        end
    end
    w−−;
end If joint implementation, then perform Algorithm 2B:

---
Algorithm 2B: ExpandArtificialNodes
---

For j=1:L−1 begin
    W := {w: Lw>1}; B := Aw; B := B + max(A) −min(B) +1;
    $A := \begin{bmatrix} A \\ B \end{bmatrix}$;
    $L_w$−−; end for ---
Algorithm3: NodeDelayAssignment (joint implementation)
---

Initialization:
For j=0:n−1
    If g is a leaf then $\delta_j(g) = D_{g,j}$;
    If g is a root then $\delta_j(g) = 0$;
    else $\delta_j(g) = \min\limits_{\substack{w \in driver(g,j) \\ \delta_j(w) \neq 0}} \delta_j(w)$;

Assignment:
∀g in cone j:
    $b_{load(g,j),g} = \delta_j(load(g,j)) - \delta_j(g)$;

V(f) Supporting Examples for Delay Assignment Algorithms for Joint Structure

The following example demonstrates how Algorithm 2B works on a joint implementation.

Consider a 5-bit S-Box whose outputs O[1] and O[3] share L=3 leaves and outputs O[2] and O[3] share L=2 leaves (as schematically shown in FIG. 17A). Let M have eight rows, five of which correspond to the shared leaves. For the Up-Stream and Down-Stream part these rows a set of 3 and a set of 2 are united into a single row each. Assume that the outcome of these steps is the A matrix presented in FIG. 17A, the united rows, noted as joint_rows (rows number 1 and 2 in FIG. 17A). These rows must be expanded back into three and two rows (3, 3_1, 3_2 and 1, 1_1). In order to comply with P1-P2, rows 3 and 1 are left untouched and the values in rows 3_1 and 3_2 and 1_1 are increased according to Algorithm 2B for j=1 and j=2 (FIGS. 17B-17C).

Figure 18:
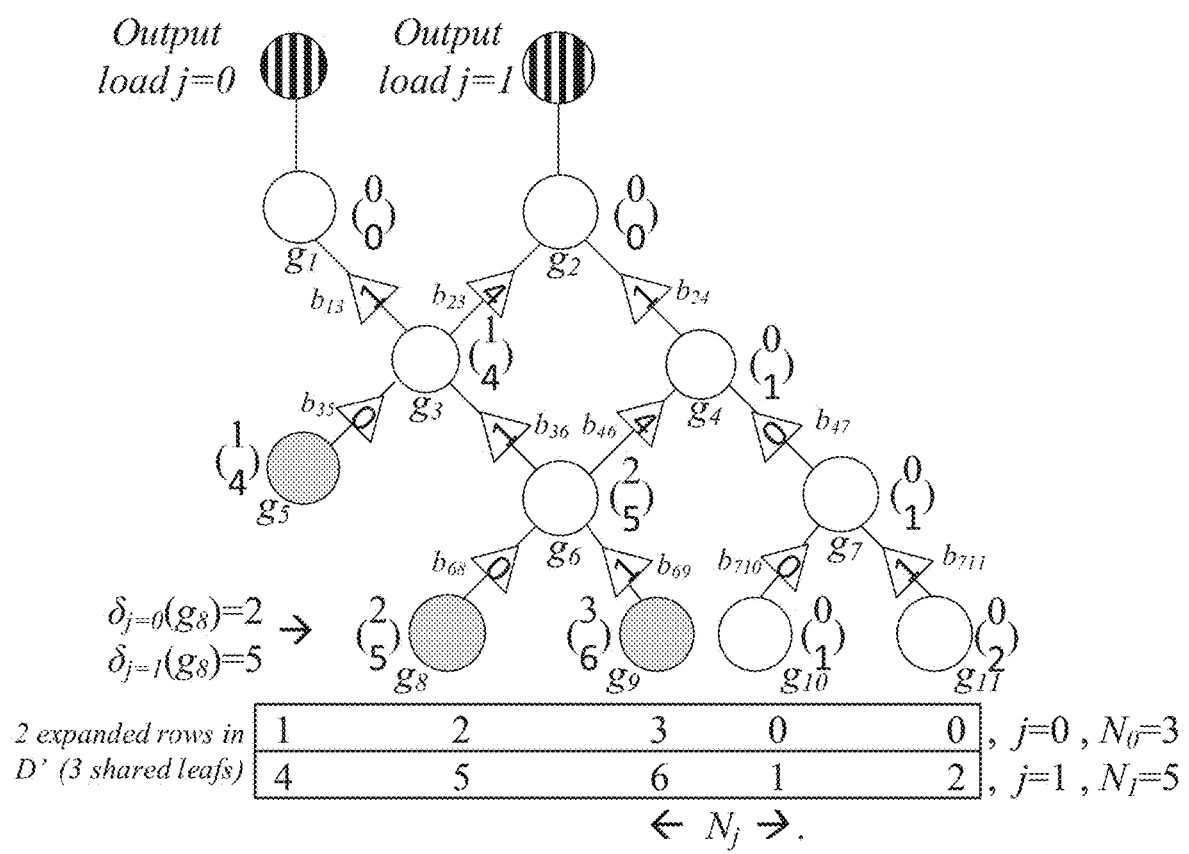
FIG. 18 is a simplified example implementing NodeDelayAssignment algorithm, according to an exemplary embodiment of the invention.

FIG. 18 shows how the NodeDelayAssignment algorithm (Algorithm 3) assigns delays to nodes in joint implementation. In FIG. 18, the differential delay D' is assigned to $L_w=2$ trees that have 3 leaves in common (diagonally striped). Note that $b_{6,9}=1$ although $\delta_0(6) \neq \delta_1(6)$ and $\delta_0(9) \neq \delta_1(9)$. This property always holds since in Alg. 2B the $L_w$ different delays assigned to the nodes in the joint cone were calculated from the delay assigned to artificial nodes by incrementing them with the same value.

The methods as described above are used in the fabrication of integrated circuit chips.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant logic circuits, logic inputs, logic outputs, logic paths, delays, delay elements, logic gates, circuit designs, electronic design automation systems, circuit synthesis systems, circuit design tools and hardware definition languages will be developed and the scope of the term logic circuit, logic input, logic output, logic path, delay, delay element, logic gate, circuit design, electronic design automation system, circuit synthesis system, circuit design tool and hardware definition language is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find calculated support in the following examples.

EXAMPLES

Reference is now made to the following examples, which together with the above descriptions illustrate some embodiments of the invention in a non-limiting fashion.

VI. The Concept of Data-Dependent Delay Simulations

VI(a) Test Benches

To simplify the design, analysis and to reduce the computational complexity involved in analog simulation, a small 4-bit ADDKEY_SBOX was chosen as a test-bench. The design was synthesized using a 65-nm standard CMOS technology process library and imported to Cadence Virtuoso for analog simulations. The nominal characterized $V_{DD}$ was 1.1 V.

The functionality of the ADDKEY_SBOX is based on a 4-bit SBOX, and is described by the following equation $Y=SBOX(X)=A\cdot X^{-1}+B$ where, the 4-bit input vector X (X!=0) is referred to as an element of the finite field $GF(2^4)$ defined by the irreducible polynomial $\pi(x)=1+X^3+X^4$. The A matrix was constructed by $D^2+D+I$ where I is the unit matrix and D is a shifted unit matrix. The B was chosen to fulfill the required conditions of invertible transformation $X\oplus Y\neq 0000$, $X\oplus Y\neq 1111$. Table 2 lists the complete truth table for the simulated SBOX.

TABLE 2

| In | SBOX (In) |
|---|---|
| 0000 | 1100 |
| 0001 | 1011 |
| 0010 | 1010 |
| 0011 | 0111 |
| 0100 | 1111 |
| 0101 | 0011 |
| 0110 | 0001 |
| 0111 | 0100 |
| 1000 | 0101 |
| 1001 | 1101 |
| 1010 | 1110 |
| 1011 | 1001 |
| 1100 | 0010 |
| 1101 | 0000 |
| 1110 | 1000 |
| 1111 | 0110 |

VI(b) Simulation Environment

Random noise due to physical effects may be averaged out by recording a large number of current traces. As this source of randomness may be filtered out, we do not simulate it. Rather, we focus on measuring randomness due to the data-dependent propagation time. In addition, simulations were performed on a stand-alone ADDKEY_SBOX whereas in real-world additional un-correlated consumers (such as other SBOXs) will add randomness to the current traces.

In order to demonstrate the contribution of data-dependent delays to circuit immunity (without the help of other contributors), we simulate a static and dynamic hazards free implementation. Dynamic hazards were removed by utilizing flip-flops which simultaneously produce an output and its complementary output, and by symmetric concatenation of AND→OR pairs; that is, the logic cone is of the form of an AND→OR→AND→OR . . . tree. This structure enables an output transition only after the slowest input arrives.

TABLE 3

| Design | Symmetric | Shifted | Shuffled |
|---|---|---|---|
| Delay | 1 | 1.357 | 1.535 |
| Energy | 1 | 1.5 | 2 |
| Area | 1 | 1.6 | 2.25 |

The Symmetric, Shifted and Shuffled designs were fully implemented (place & routed in Cadence Encounter EDI tool). The design voltage supplies were isolated in separate voltage islands to ensure noiseless measurements. The additional delay elements were embedded in the circuit to support the Shifted and shuffling operations. All designs were analog simulated after parasitic extraction in Cadence Virtuoso simulator and their average energy per operation, delay and area utilization are shown in Table 3, normalized to the symmetric design.

The efficiency of the suggested structures is evaluated by the SNR criterion. In our noiseless simulation, some of the measured SNR values are larger than 1. This does not mean that every attack will succeed. In real life, all the previously mentioned sources of randomness may decrease the SNR below 1. Namely, the SNR values given herein refer only to the (hypothetical) worst case scenario.

VI(c) Simulation Results: Output Voltage Distribution

Reference is now made to FIGS. 19A-19F which show noiseless simulation results for symmetric, shifted and shuffled designs.

Figure 19A:
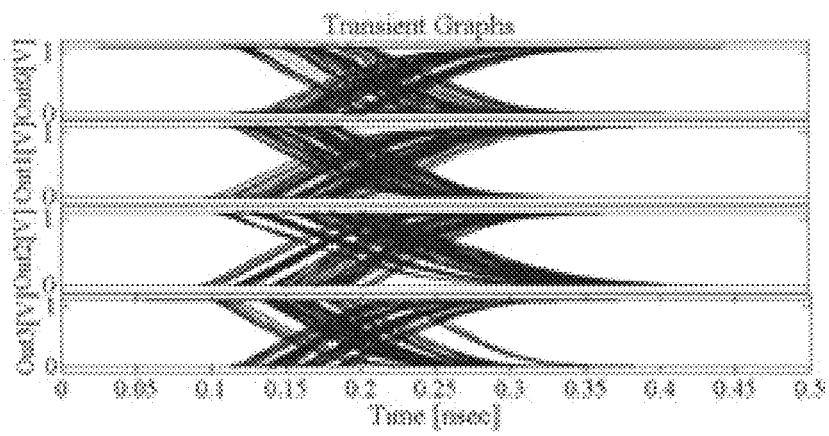
FIGS. 19A, 19B, 19C are graphs of transient output voltages for noiseless simulations of exemplary Symmetric, Shifted and Shuffled Designs respectively.

FIG. 19A shows the noiseless traces of output voltage transitions (for different plaintext) in a Symmetric design. The figure shows that it is difficult to balance the propagation time when using gates from a standard cell library. Note that only the rising output voltage transitions need to be considered because they alone consume current from $V_{DD}$. Short circuit currents take place when both transitions occur. Therefore they reveal less information and are very small compared to the dynamic power; additionally their dissipation duration is smaller and are typically not used for attacks.

Figure 19B:
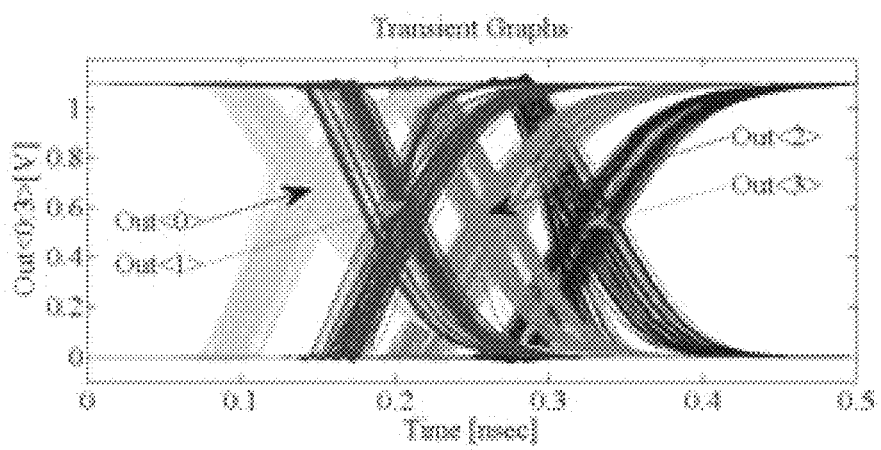
Figure 19C:
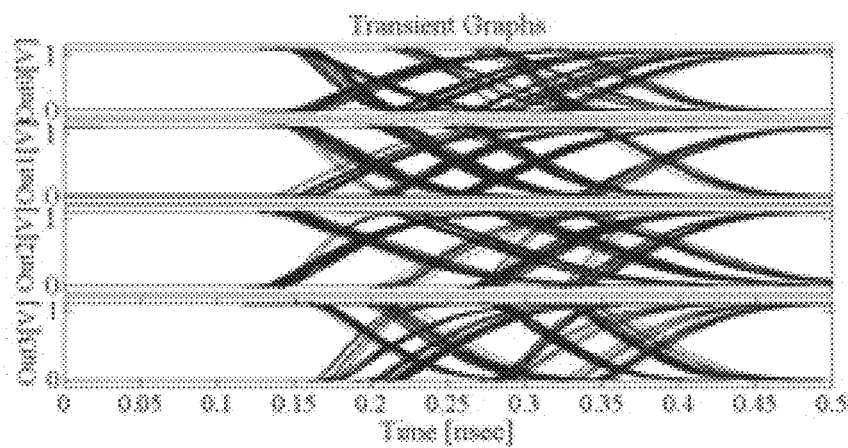
Figure 19D:
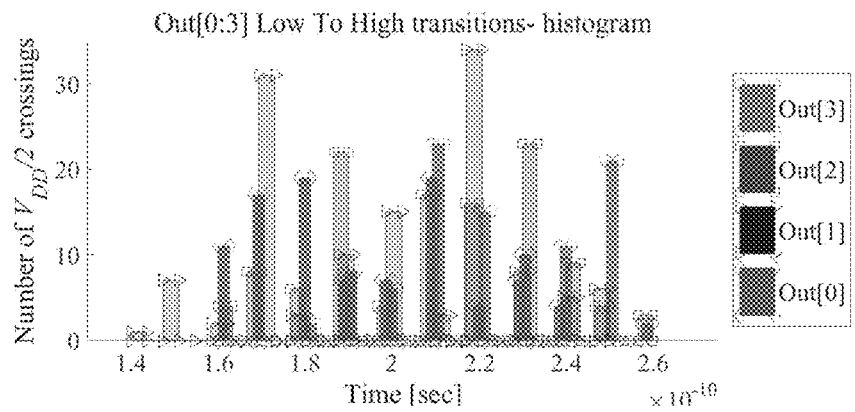
FIGS. 19D, 19E, 19F are histograms of Output voltage crossing of $V_{DD}/2$ for noiseless simulations of exemplary Symmetric, Shifted and Shuffled Designs respectively.

A histogram of the time it took the voltage to cross $V_{DD}/2$ is shown in FIG. 19D. The clock cycle time was 5 ns. The average arrival time of all bits was 2 ns with a variance of σ=0.2 ns. It is important to note that the average arrival time (t') differed between outputs; however, the variance of t' was 0.02 ns which is negligible with respect to the clock cycle and the variance σ. The variance in the VDD/2 crossing time is small compared to the observed consumed current duration and may be considered negligible. The width of the current pulse was at least 50% of the signal rise-time (10-90% is about 1.5 nsec). This negligible variance makes it possible to refer to this symmetric design as balanced (although imperfect). That is, all outputs arrive at the same time with a small (but unavoidable) variance. In fact, the variance is so small that there is a very high probability that the current is consumed simultaneously by all outputs (see FIGS. 19A and 19D).

Figure 19E:
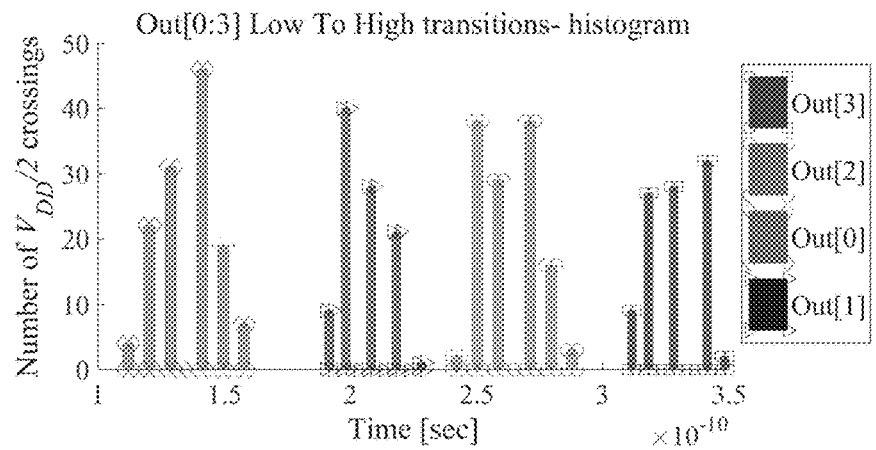
Figure 19F:
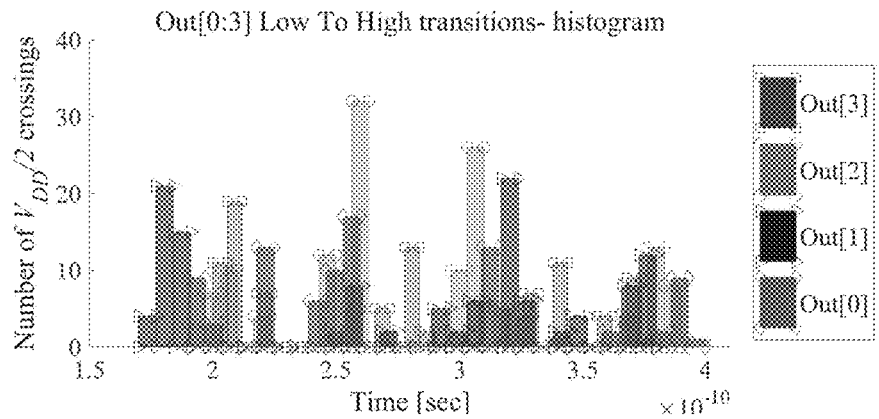

Output voltage transition traces and their corresponding histograms for the time the output voltage crosses $V_{DD}/2$ in the shifted and shuffled designs are shown in FIGS. 19B, 19E and 19F respectively. It is clear from the figures that Shuffling increases the data-dependent delay variance of the output by X2 of the Symmetric design (~0.04 ns). In fact, the rising voltage cluster is now divided into smaller clusters with delay between each other. A higher granularity could be achieved with additional design efforts. This depends on the number of logic stages and input to output paths in the design. For purposes of illustration, we chose this simple design. Recall that the voltage traces in FIGS. 19A-19F are noise free; they only reflect data dependency. Clearly, in real world, the histograms will be smoother.

VII. The Relationship Between Intra-Cycle Information Leakage and a Successful Power Analysis Attack This section shows that intra-cycle currents increase the immunity against Multi-Bit attacks as they reduce the SNR by at least 25% in a standard CMOS design. It also shows that the intra-cycle data-dependent propagation delay could be utilized as another layer of protection for Dual-Rail designs.

VII(a) Data-Dependency in Standard CMOS as a Barrier Against PA

The correlation between the measured current and eq. (1) varies in time for CMOS design. Recall that we present the worst case scenario (i.e. noiseless) whereas in practice the difference in correlation values between the correct and the wrong key would be much smaller.

The correlation is shown in FIGS. 20A-20L. In all figures, the correlation values $\rho_{t,k}$ between $I_t^m$ and $I_k^h$, when a wrong key is assumed, are plotted as solid lines, the correlation when the correct key is assumed is plotted as a solid line with dots, and a wrong key correlation that produces the maximal correlation is plotted is a dashed line. Note that the Y axis is different in each figure.

We performed MultiBit and SingleBit attacks on the three designs. The measurement setup is depicted in FIG. 1.

Figure 20A:
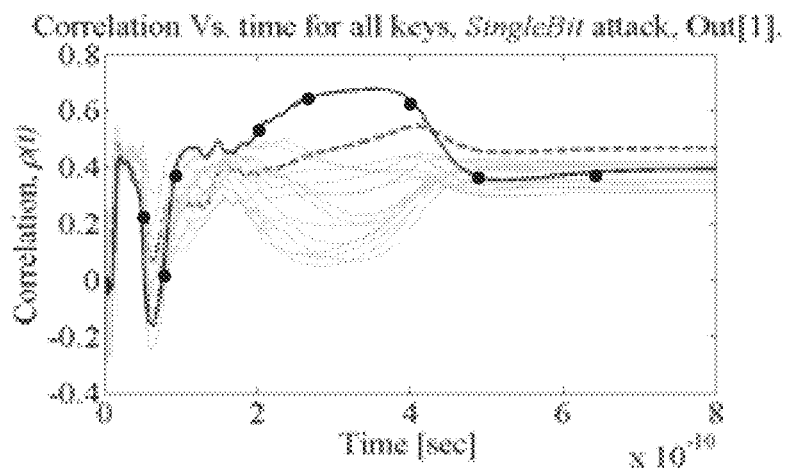
FIGS. 20A-20L are graphs of Correlation coefficients of simulated SingleBit and MultiBit attacks for exemplary Symmetric, Shifted and Shuffled Designs.
Figure 20B:
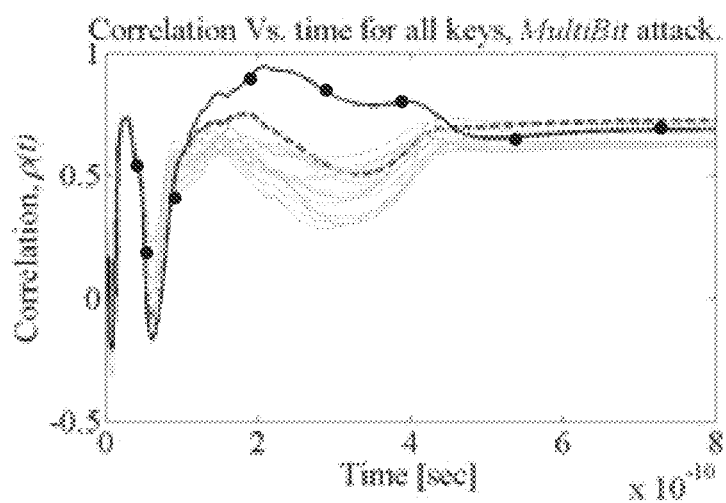
Figure 20C:
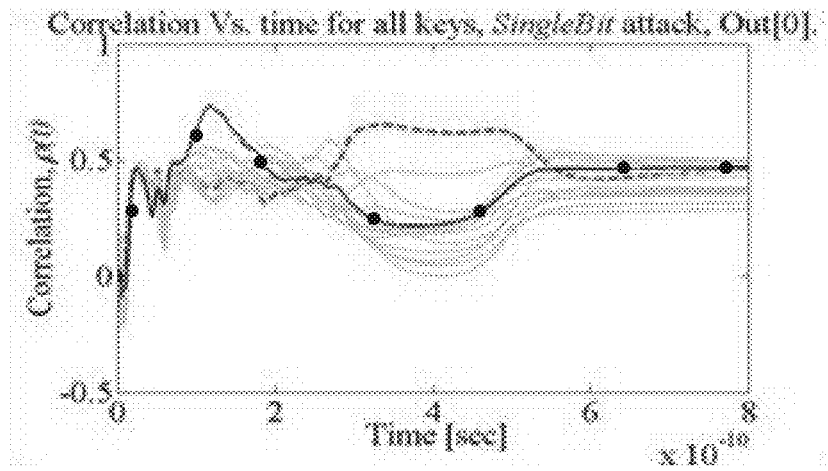
Figure 20D:
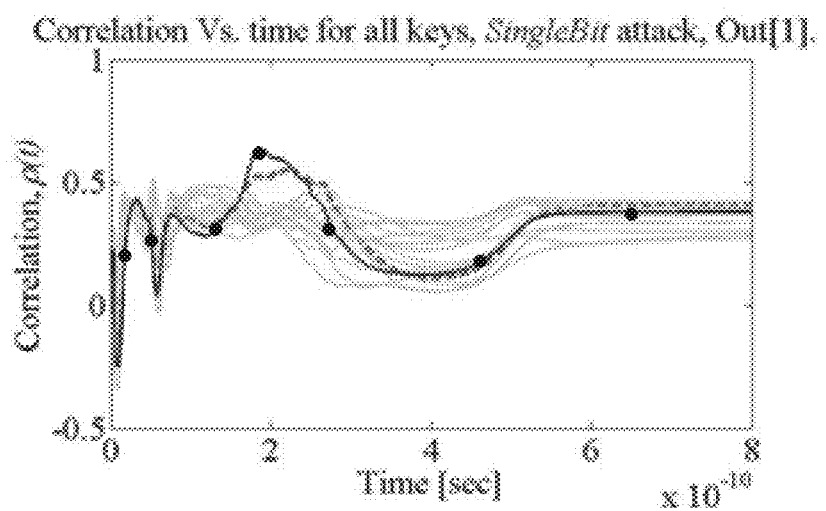
Figure 20E:
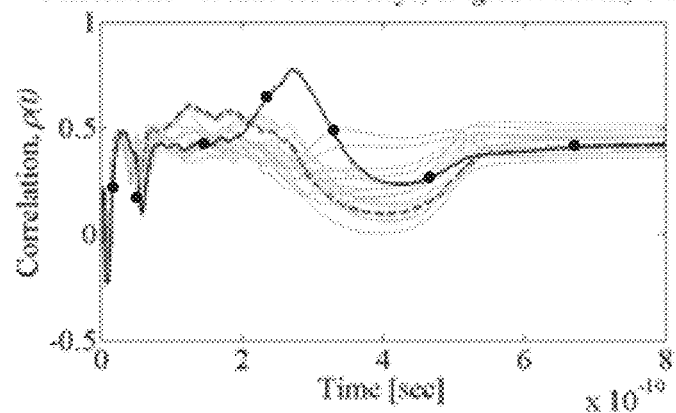
Figure 20F:
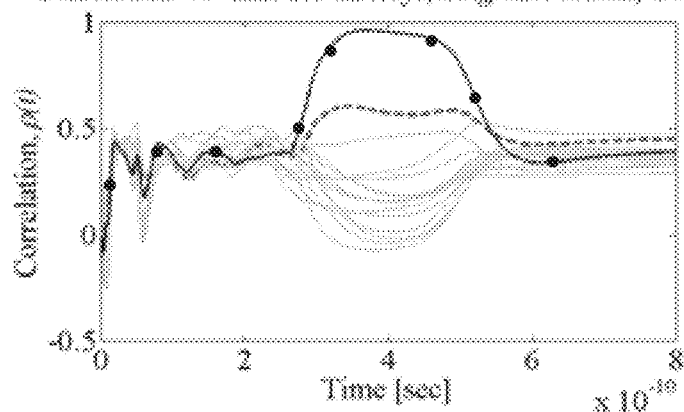
Figure 20G:
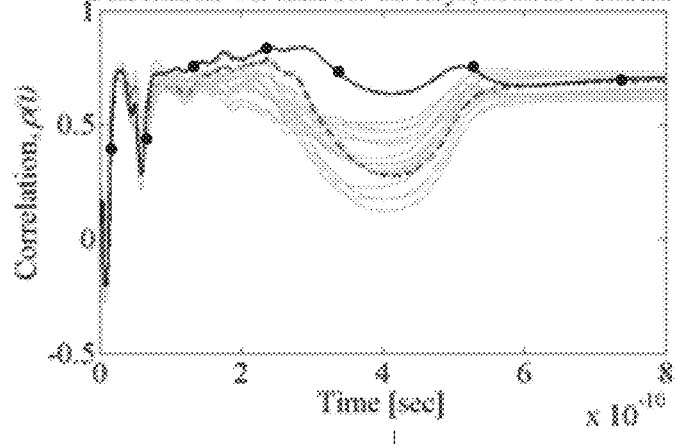
Figure 20H:
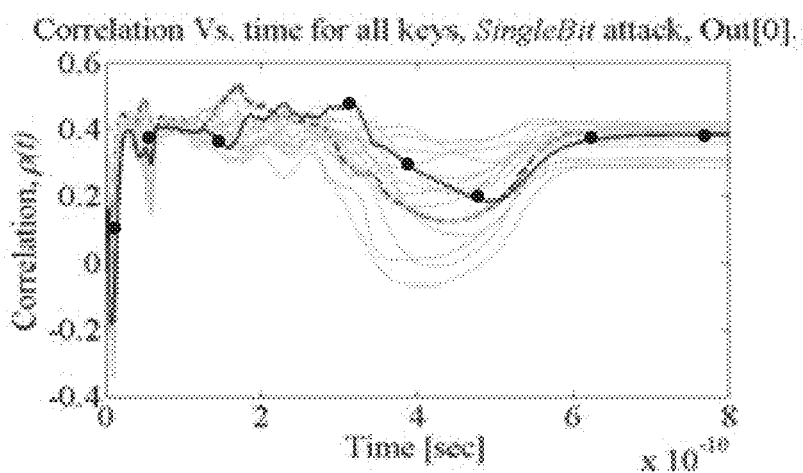
Figure 20I:
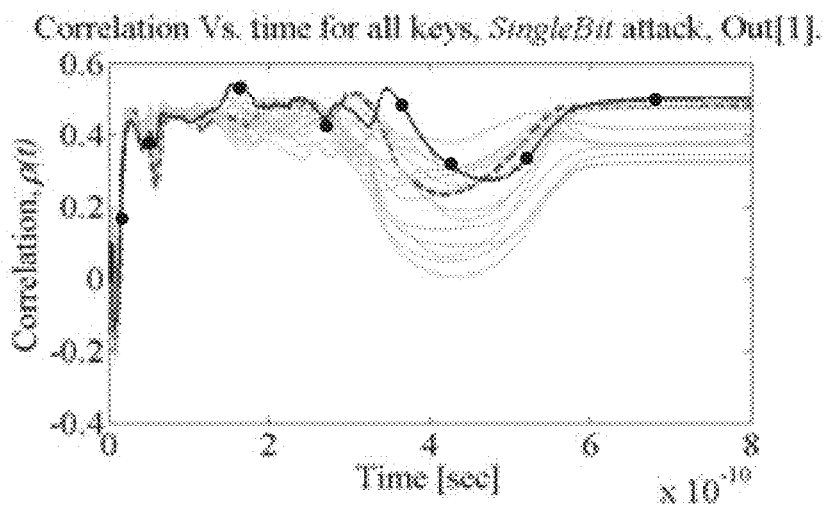
Figure 20J:
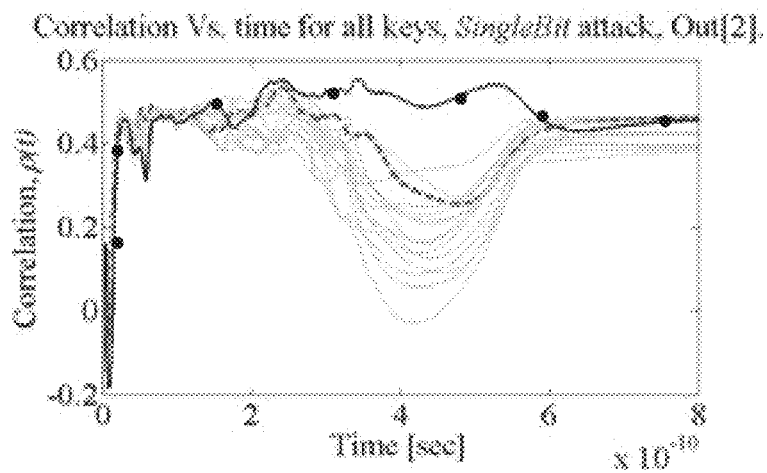
Figure 20K:
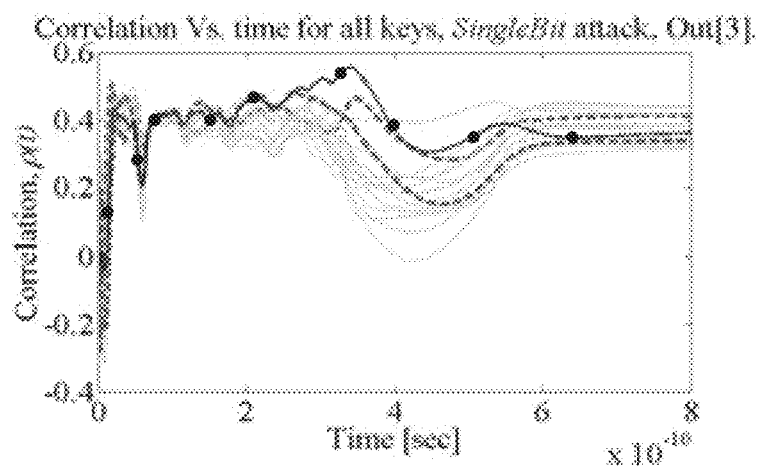
Figure 20L:
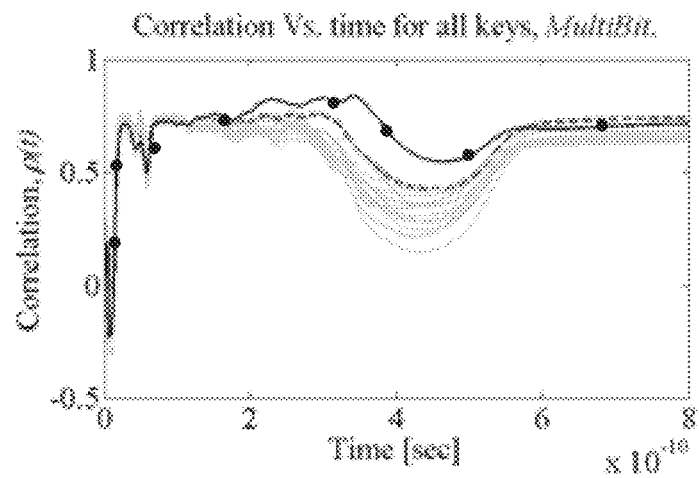

FIGS. 20A and 20B show how the correlations vary in time for the Single- and Multi-bit attacks on a Symmetric design, respectively. It is clear from these figures that the correct key introduces high correlation values for a relatively long period (0.17 ns).

FIGS. 20C-20G show how the SingleBit correlation values vary in time by ~0.65 ns in a Shifted design as a result of the inserted delay. Successful SingleBit attacks occur at different shifted times (which are synchronized to the output arrival times). FIGS. 20H-20L show how the correlation values vary in time in a shuffled design. As can be seen, the Shuffled design produces a smaller difference between the correct and wrong key correlations as compared to the Symmetric and Shifted designs. Consequently, as we show next, the SNR in this design is very low. In real life, the random noise would decrease the SNR even more.

The efficiency of a data-dependent propagation delay as a countermeasure may be evaluated by the SNR criterion. The SNR values for all three designs for SingleBit and MultiBit attacks are summarized in FIGS. 21-22. The SNR values for SingleBit attacks were computed from simulations of noiseless traces. This is why exactly $2^4*2^4$ transitions capture all the possible transitions. It is clear from FIG. 10 that in a SingleBit attack the Shifted design is the worst design methodology from a security perspective since in the worst-case the SNR is 1.6 while the Symmetric and Shuffled SNR is 1.22 and 1.09, respectively. On the other hand, the Shuffled design provides smaller SNR values which directly translate to higher immunity to SingleBit attacks. In fact the average SingleBit attack SNR of the Shuffled design is 1.01 as compared to 1.29 and 1.14 of the Shifted and Symmetric designs, respectively.

Figure 23:
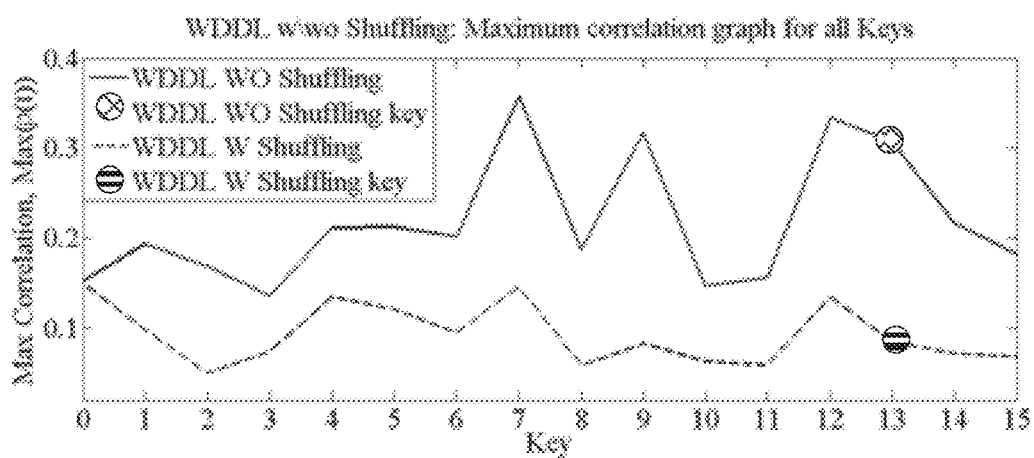
FIG. 23 is a graph showing correlation coefficients for all possible keys computed for an exemplary wave dynamic differential logic (WDDL) implementation with and without Shuffling.

The SNR values for MultiBit attacks as well as the average SingleBit attacks are shown in FIG. 23. It may be seen that the Shuffled design turns out to be much better in terms of SNR values than either the Symmetric or Shifted designs. These results clearly demonstrate that intra-cycle information leakage may be utilized as a countermeasure. In other words, a data-dependent propagation delay adds randomness which cannot be filtered out by averaging. From this point of view, this component of randomness may be considered stronger than other sources of randomness (thermal noise, voltage fluctuations and current drawn from other modules in the architecture).

VII(b) Implementation Cost vs. Security

Figure 21:
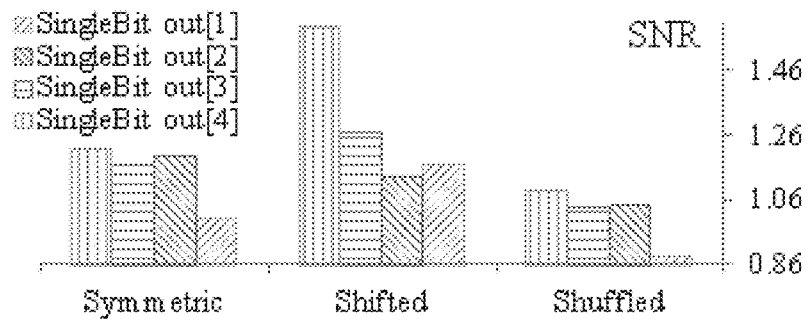
FIG. 21 shows the SNR of Symmetric, Shifted and Shuffled exemplary designs for the four SingleBit attacks.
Figure 22:
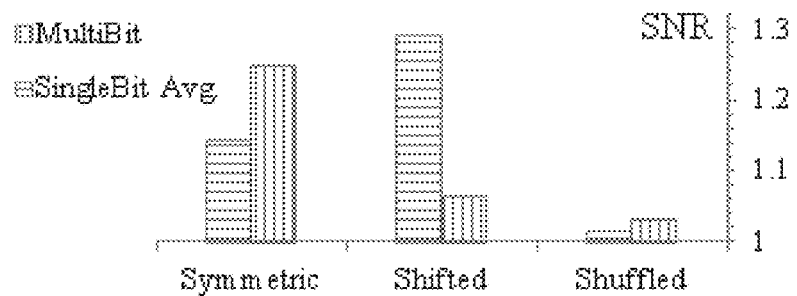
FIG. 22 shows the SNR of Symmetric, Shifted and Shuffled exemplary designs for the Average SingleBit and MultiBit attacks.

CMOS designs are sensitive to PA attacks; they introduce SNR values larger than 1 (see FIG. 21). However, the SNR may be reduced significantly by employing a Shuffled design. Table 4 shows the tradeoffs between the SNR and the delay variance (and hence delay penalty) in the Shuffled designs subjected to Single- and Multi-Bit Attacks. It is clear from this table that as the delay-variance increases, the SNR in a MultiBit (worst-case SingleBit) attack decreases from 1.25 (1.16) to 0.99 (0.99).

TABLE 4

| | Design delay (Normalized to unprotected design) | | | | |
|---|---|---|---|---|---|
| | 1 | 1.25 | 1.53 | 2 | 3 |
| Design area (Normalized to unprotected design) | 1 | 1.6 | 2.25 | 3.2 | 5 |
| Single Bit 1 Attack | 1.19 | 1.1252 | 0.9321 | 0.92887 | 0.98707 |
| Single Bit 2 Attack | 1.2 | 1.1328 | 1.0615 | 0.98513 | 0.95755 |
| Single Bit 3 Attack | 1.16 | 1.1215 | 1.0675 | 1.04762 | 0.99817 |
| Single Bit 4 Attack | 1.219 | 1.2178 | 1.0717 | 0.94824 | 0.89881 |
| Multi Bit Attack | 1.25 | 1.2105 | 1.0370 | 1.01876 | 0.9949 |

Recall that the SNR in Table 4 describes the worst-case scenario, that is, noise free (i.e. accurate) measurements of the power supply current with no active current consumers in the system other than the SBOX gates. Clearly, noisy current samples may reduce the SNR below 1. Note that the columns in Table 4 represent different delay penalties (which correspond to operating frequency penalties).

VII(c) Shuffled Design as an Add-On Barrier for Dual-rail Design

In this section, we show that Shuffling may be added on top of other circuit level countermeasures. We show that the SNR of security oriented logic families (i.e., families that aim to provide a SNR smaller than 1) may be reduced even more by using the proposed method.

Dual rail precharge countermeasures such as Sense Amplifier Based Logic, SABL, Wave Dynamic and Differential Logic, WDDL, DWDDL, Dual Spacer Dual Rail, DSDR etc. are designed to consume equal energy per clock-cycle by both charging and discharging gate outputs independently of the data processed, making them data-independent. Though theoretically some of these methods have been shown to remove data-dependent energy consumption, information leaks from the intra-cycle instantaneously due to the imbalance in arrival time, or the power dissipation due to capacitance mismatch (gate or interconnect).

In fact, Shuffling does not change the energy per cycle and thus may be used as another source of randomness which creates another barrier against power analysis attacks. A hazard free WDDL 4-bit SBOX was designed in 65 nm technology. This design was simulated and analyzed by applying the same procedures were used for the standard CMOS. Standard WDDL logic gates as well as WDDL buffers were used. The simulations were performed without noise; therefore $2^4*2^4$ traces were sufficient to capture all possible transitions. The standard clocking scheme of WDDL was implemented (one clock cycle for precharge and one clock cycle for evaluation).

The correlation coefficients, $\rho_k(t)$, for all possible keys were computed for the WDDL design with and without Shuffling. The maximum correlation values (in time) for both designs for all possible keys were extracted from $\rho_k(t)$. These values are shown in FIG. 23 with and without Shuffling. The results indicate that adding data-dependent Shuffling to the WDDL design decreased the SNR (from 0.85 without Shuffling to 0.55 with Shuffling for WDDL implementation). Furthermore, not only did the SNR decrease but the same was true for the correlation values range which shrunk and lowered from [0.15;0.36] to [0.036; 0.155]). It is thus reasonable to view the data-dependency as an additional barrier against PA attacks which is orthogonal to other circuit level countermeasures.

VIII. Delay Assignment Methodology Simulations

This section is devoted to simulation of first order power analysis attacks on non-disjoint logic circuit topologies. In it we describe the simulation environment and explain why, in terms of security, this environment simulates the worst case scenario, report the improvement obtained by delay assignment via the mates matrix, and examine the security-level, area and frequency tradeoffs.

It is important to note that all the test bench circuits were synthesized from a single HDL description of the SBOX. The resulting gate-level netlist was parsed and processed by the algorithm in Matlab. The delays (composed of buffers in cascade) were inserted into the netlist which was then imported to Cadence Virtuoso for analog simulations.

Overall, more than 300 different designs passed the power analysis following the analog simulations.

VIII(a) Test Benches and Simulation Environment

To simplify the design, analysis, and more importantly in order to reduce the computational complexity involved in the analog simulation, a small 4-bit AddKey_SBOX was chosen as a test-bench. The design was synthesized using a 65-nm standard CMOS technology process library and imported to Cadence Virtuoso for analog simulations. The nominal characterized $V_{DD}$ was 1.1 V.

The functionality of the AddKey_SBOX was based on the 4-bit SBOX described in M. Avital, H. Dagan, O. Keren, and A. Fish, "Randomized Multitopology Logic Against Differential Power Analysis," *IEEE Trans. Very Large Scale Integr. VLSI Syst.*, Early Access, 2014, which is incorporated herein by reference.

Uncorrelated random noise due to physical effects may be averaged out by recording a large number of current traces. As this source of randomness may be filtered out, we did not simulate it. Rather, we focused on testing the data-dependent effects (which are considered as noise in the eyes of the attacker). That is, we provide the attacker perfectly synchronized and uncorrelated noise free samples. (Perfectly synchronized noise free samples are equivalent to recording an infinite number of traces from actual systems.) Moreover, the simulations were performed on a stand-alone AddKey_SBOX whereas in the real-world additional uncorrelated consumers (such as other SBOXs) will add randomness to the current traces. Consequently, in terms of security, the SNR was evaluated in the worst (hypothetical) scenario. The results reported in this paper are based on analysis of all 256 possible input transitions.

VIII(b) SNR Simulation Results

In this sub-section, we present simulations comparing the efficiency of three delay assignment approaches: random delay (RD) assignment, mates matrix based delay assignment (MD), and a permutated delay (PD) assignment. The MD assignments were obtained by running the whole procedure i.e. PathGrouping, PathDelayAssignment and NodeDelayAssignment. The PD works directly on the initial delay matrix $D^0$ and transforms it into a sub Latin square D by applying permutations. In RD the assigned delays are uniformly distribution over the clock cycle. All designs have the same $\overline{D}$.

Recall that an attacker can choose how many bits to attack. Since our test bench was a 4-bit SBOX, an attacker could perform four different SingleBit attacks, six different DoubleBit attacks, etc. The results shown in the next figures represent the average SNR over all the possible i-bit attacks (i=1, ... , 4).

FIGS. 24A-24D shows the average SNR in an i-bit attack. The x-axis represents the latency Δ of each unit delay element in multiples of $T_{buff}$. The SNR of the original synthesized CMOS circuit (i.e. without embedded delays) corresponds to Δ=0. Note that the larger Δ is, the lower the clock frequency. The vertical bars mark the standard deviation, σ of the SNR. The worst delay assignment (WC) is plotted as a dashed line while MD, PD and RD are plotted as solid lines. The worst assignment sets the same delay to all paths. This was done to simulate the key assumption behind power analysis that there is a single point in time at which the correlation is maximal for all bits. The circle/rectangle marks on these lines show the minimal value of Δ for which our primary goal (of decreasing the SNR below one) was achieved.

It is clear from the FIGS. 24A-24D that data-dependent delays (even when randomly assigned) may be used as a barrier to PA. Note that in FIGS. 24A-24D, the WC SNR decreased moderately as Δ increased; this is an artifact, due to parasitic imbalance of transition times of the gates as the chain length increased.

Figure 24A:
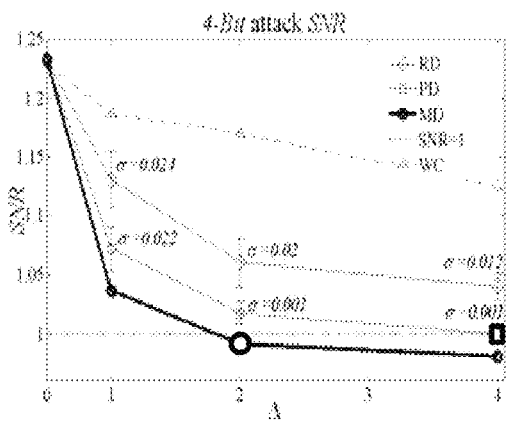
FIGS. 24A-24D show simulation results of the average SNR for 4, 3, 2 and 1 bit attacks respectively.
Figure 24B:
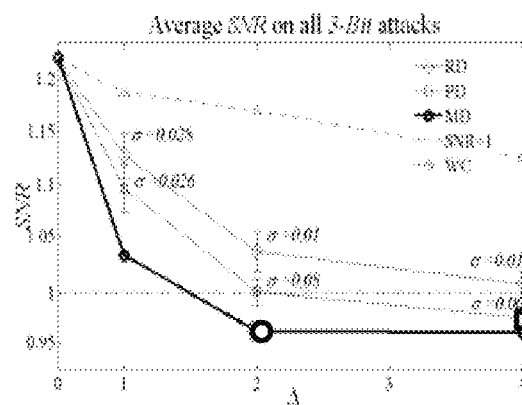
Figure 24C:
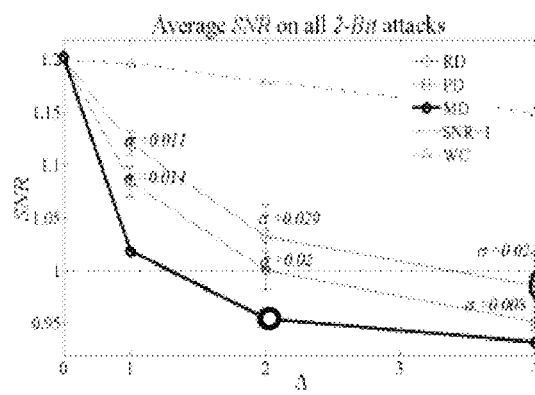
Figure 24D:
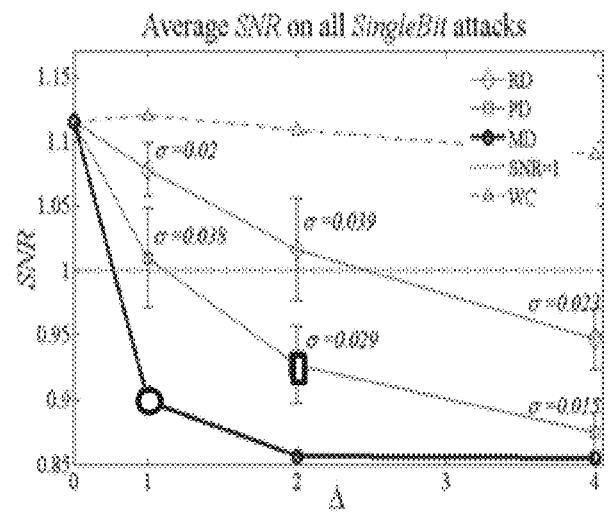

The SNR values presented in FIGS. 24A-24D clearly demonstrate the efficiency of the MD approach. Moreover, for a 4-bit attack, the MD had a SNR below one for Δ=2, whereas on average, the PD can cross this bar only for Δ=4. The average SNR of the RD equals 1.04 for Δ=4. Recall that FIGS. 24A-24D present the average SNR. For example FIG. 24D presents the average SNR in a SingleBit attack. The MD assignment had a SNR=0.89 (<1) with Δ=1; the PD had an average SNR=0.93 with Δ=2, and the RD required Δ=3 to achieve an average SNR=0.97.

Figure 25:
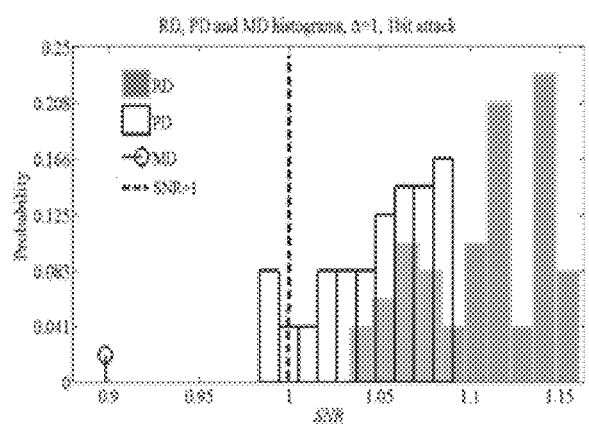
FIG. 25 shows simulation results of the SNR probability distribution in a SingleBit attack with for the PD and RD assignments.

FIG. 25 shows the SNR probability distribution in a SingleBit attack with Δ=1 for the PD and RD assignments (the sample size was 50 different designs for each). The vertical dashed line marks the SNR=1 bar. Note that only four PD designs (out of the 50) were able to reduce the initial SNR below one.

Figure 26A:
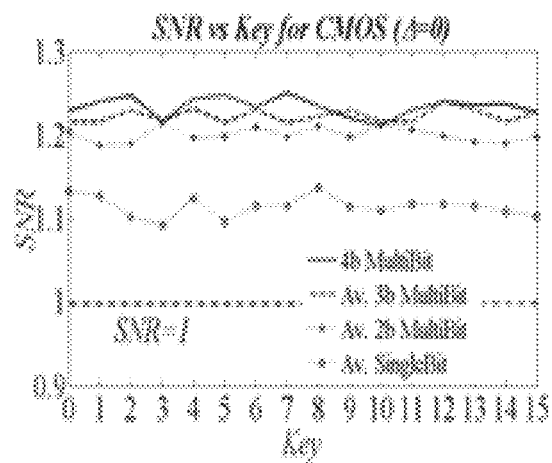
FIGS. 26A-26B show simulation results of the SNR of the unprotected design and the MD design for all possible chosen keys.
Figure 26B:
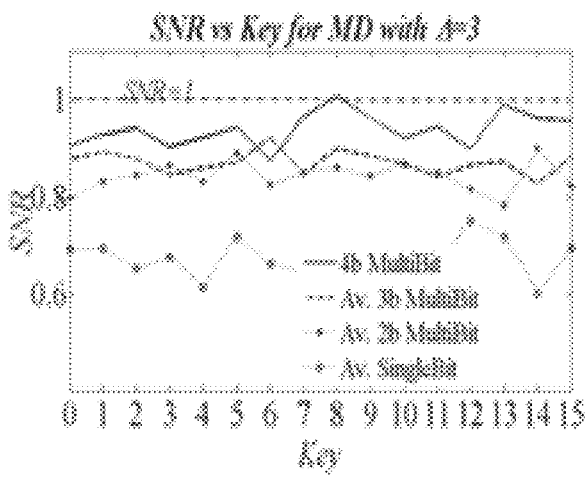

To show that the design methodology is not biased toward a specific key, FIGS. 26A-26B show the SNR of the unprotected design (Δ=0) and the MD design with Δ=3 for all possible chosen keys. These figures clearly show that the proposed methodology is not biased. Note that the SNR values in FIG. 26B are smaller than one. This means that with high probability a wrong key will be chosen. An attacker who may be aware to this fact may ignore the key that gains the maximal correlation value and choose the second best key. SNR values calculated with second best key are close to one.

VIII(c) Tradeoffs

Increased silicon area utilization directly implies that dynamic- and leakage-energy increases. Typically, a larger area also corresponds to larger clock periods (lower frequencies) and therefore increased static energy.

Figure 27:
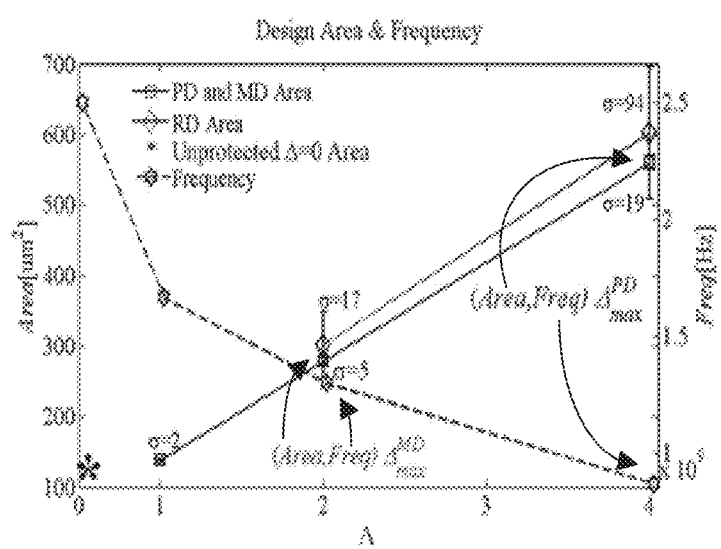
FIG. 27 shows design area utilization and frequency for the MD, the PD and RD designs and their standard deviations.

The area utilization of the three assignments, RD, PD and MD are shown in FIG. 27. The x-axis corresponds to Δ, and the left y-axis to the area. For PD and RD, the solid line represents the average area and the vertical bars are the variance. FIG. 27 shows that area increases almost linearly with Δ.

For a fair comparison the NodeDelayAssignment algorithm was applied on the PD to reduce the area overhead. The area utilization of the MD is close to the average PD. This however could not be done for RD since the random delays were embedded into the circuit at random places. This in turn resulted in a larger σ than for the PD.

The right y-axis in FIG. 27 shows the critical-path frequency of the designs (dashed line). As expected, the frequency was similar for all designs since each design had at least one critical path with the maximal delay. This frequency decreased rapidly as Δ increased.

In order to emphasize the area-SNR tradeoffs, FIG. 27. marks $(Area, freq)_{\Delta_{max}}$ for those pairs that provide immunity (SNR<1). Define $\Delta_i$ which provides an SNR<1 for an $i$-bit attack. $\Delta_{max} = \max(\Delta_i)$ For example the MD and RD designs have:

$$\Delta_{max}^{MD} = \max(2,2,2,1) = 2 \Delta_{max}^{RD} = \max(12,6,4,4) = 12.$$

Note that to protect the whole system the design used $\Delta_{max}$. From the figure it holds that:

MD design: (280 um$^2$, 1.25 GHz)$_2$
PD designs: (560 um$^2$, 0.85 GHz)$_4$ on average.
RD designs: an unacceptable (1700 um$^2$, 0.55 GHz)$_{15}$ on average.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of designing a logic circuit with data-dependent delays, wherein said logic circuit comprises a plurality of logic paths from logic inputs to at least one logic output, said method comprising:
    using an electronic design automation system:
    obtaining an initial circuit design;
    specifying respective delays for a plurality of logic paths in said initial circuit design such that at least some of said outputs switch at different times within a clock cycle for different combinations of logic input levels; and
    forming a second circuit design having said specified respective delays along said respective logic paths by adding delay elements to said initial circuit design based on said specified respective delays,
    wherein for at least one of said logic paths said method further comprises:
    calculating a respective initial delay for said at least one logic path by analyzing said initial circuit design; and
    based on said initial delay, calculating a number of delay elements required for insertion into said at least one logic path to obtain said specified respective delay.

2. A method according to claim 1, further comprising:
    analyzing a power utilization spread of said second circuit design;
    calculating an attainable power utilization spread of said initial circuit design; and
    when said power utilization spread of said second circuit design is less than said attainable power utilization spread, changing at least one of said delays to form a third circuit design having a greater power utilization spread.

3. A method according to claim 1, wherein said forming a second circuit design comprises:
    selecting locations in logic paths of said initial circuit design for embedding delay elements to obtain said specified respective delays along said logic paths; and
    embedding said delay elements into said selected locations.

4. A method according to claim 1, wherein at least one of said delay elements comprises:
    a buffer;
    a combination of buffers;
    a logic gate;
    a combination of logic gates;
    a wire;
    a resistive element;
    a capacitive element; and
    a connection between logic gates.

5. A method according to claim 1, wherein said adding delay elements comprises at least one of:
    inserting a resistive element into said initial design;
    inserting a capacitive element into said initial design;
    adjusting cell sizing;
    adjusting circuit layout; and
    tuning driving strength.

6. A method according to claim 1, wherein said respective delays create intra-cycle delays within a single output for different combinations of logic input levels.

7. A method according to claim 1, wherein said respective delays create intra-cycle delays amongst a plurality of said outputs for different combinations of logic input levels.

8. A method according to claim 1, wherein said respective delays create, for different combinations of logic input levels, intra-cycle delays within at least one single output and amongst a plurality of said outputs.

9. A method according to claim 1, further comprising adjusting said second circuit design to reduce a maximal number of delay elements respectively added to said logic paths.

10. A method according to claim 1, further comprising adjusting said second circuit design to reduce a respective difference between a maximal and minimal number of delay elements assigned to logic paths within each logic cone from said logic inputs to said logic outputs, and to reduce a respective difference between a maximal and minimal number of delay elements assigned to logic paths in which switching activity occurs simultaneously at different outputs.

11. A method according to claim 1, wherein said specifying comprises:
    partitioning said logic paths into groups, at least one of said groups comprising a plurality of logic paths in which switching activity occurs simultaneously at different outputs; and
    for at least one of said groups, assigning different respective delays to logic paths within said group.

12. A method according to claim 1, wherein said specifying comprises:
    identifying sets of inputs with correlated switching times for a plurality of outputs; and
    for at least one of said sets of inputs, assigning different respective delays to logic paths from inputs in said set to said outputs with correlated switching.

13. A method according to claim 1, wherein said specifying comprises assigning a respective common delay to all logic paths to a single output, wherein said respective common delays are different for at least some of said outputs.

14. A method according to claim 1, wherein said specifying comprises assigning different respective delays to at least some logic paths to a single output.

15. A method according to claim 1, wherein for at least some of said logic paths, a number of delay elements added to said logic path is randomly selected from a specified range.

16. A method according to claim 1, wherein said logic circuit comprises a logic cone comprising a plurality of logic paths from said inputs to a single output, and said specifying comprises:
   forming a delay vector, a length of said delay vector equaling at least a number of said logic paths in said logic cone, each element of said delay vector specifying a number of delay elements;
   forming a set of permutations of said delay vector;
   randomly selecting one of said permutations;
   for each of said logic paths forming said logic cone, adding a number of delay elements given by a respective element of said selected permutation.

17. A method according to claim 1, wherein said specifying comprises:
   partitioning said logic paths into groups, at least one of said groups comprising a plurality of logic paths in which switching activity will occur simultaneously at different outputs;
   generating a mates matrix, each row of said matrix corresponding to a respective one of said groups, each column of said matrix corresponding to a respective one of said outputs, wherein each cell of said matrix specifies a path from said respective group to said respective output;
   for each row of said mates matrix, assigning a different respective number of delay elements to each path in said row;
   for each column of said mates matrix, assigning a different respective number of delay elements to each path in said column; and
   calculating a respective number of delay elements to add to each of said logic paths to conform to said mates matrix.

18. A method according to claim 10, further comprising reducing a difference between a maximal and a minimal number of delay elements assigned to each of said rows and a difference between a maximal and a minimal number of delay elements assigned to each of said columns to the smallest possible numbers.

19. A method according to claim 10, further comprising reducing a maximal number of delay elements assigned to said cells to a smallest possible number.

20. A method according to claim 1, further comprising adjusting said second circuit design to reduce resource costs for embedding said delay elements in said logic paths to obtain said specified respective delays.

21. A method according to claim 20, wherein said resource costs comprise at least one of:
   circuit area;
   circuit power consumption; and
   a total number of delay elements added to said logic circuit.

22. A method according to claim 1, wherein said logic circuit comprises a plurality of logic cones from said logic inputs to said logic outputs and said specifying is performed independently for each logic cone.

23. A method according to claim 1, wherein said logic paths form disjoint logic cones to said outputs.

24. A method according to claim 1, wherein at least two logic cones formed by said logic paths to said outputs have a common logic gate, and said specified respective delays create, for different combinations of logic input levels, intra-cycle delays within at least one single output and amongst a plurality of said outputs.

25. A method according to claim 1, wherein said obtaining an initial circuit design comprises:
   defining said logic circuit with a hardware description language (HDL); and
   synthesizing said HDL definition into an initial netlist representing said initial circuit design.

26. A method according to claim 25, wherein said forming said second circuit design comprises adding said specified respective delays into said initial netlist to create a second netlist representing said second circuit design.

* * * * *